(12) United States Patent
Sasaki et al.

(10) Patent No.: US 8,455,173 B2
(45) Date of Patent: Jun. 4, 2013

(54) PHOTOSENSITIVE INSULATING RESIN COMPOSITION, CURED PRODUCT OF THE COMPOSITION, AND METHOD OF PRODUCING INSULATING FILM

(75) Inventors: Hirofumi Sasaki, Tokyo (JP); Atsushi Itou, Tokyo (JP)

(73) Assignee: JSR Corporation, Tokyo (JP)

( * ) Notice: Subject to any disclaimer, the term of this patent is extended or adjusted under 35 U.S.C. 154(b) by 541 days.

(21) Appl. No.: 12/696,021

(22) Filed: Jan. 28, 2010

(65) Prior Publication Data

US 2010/0196822 A1 Aug. 5, 2010

(30) Foreign Application Priority Data

Jan. 30, 2009 (JP) ................................. 2009-020665
Dec. 9, 2009 (JP) ................................. 2009-279870

(51) Int. Cl.
*G03F 7/038* (2006.01)
*G03F 7/20* (2006.01)
*G03F 7/004* (2006.01)
*G03F 7/023* (2006.01)
*G03F 7/38* (2006.01)
*G03F 7/40* (2006.01)
*C08K 5/1525* (2006.01)
*C08K 5/17* (2006.01)

(52) U.S. Cl.
USPC ..................... 430/192; 430/280.1; 430/270.1; 430/325; 430/326; 430/18

(58) Field of Classification Search
None
See application file for complete search history.

(56) References Cited

U.S. PATENT DOCUMENTS

| 4,243,743 | A | * | 1/1981 | Hiramoto et al. .......... 430/281.1 |
| 5,348,835 | A | * | 9/1994 | Oba et al. ..................... 430/192 |
| 2008/0097032 | A1 | * | 4/2008 | Ito et al. ..................... 525/185 |
| 2009/0239080 | A1 | * | 9/2009 | Ito et al. ..................... 428/411.1 |

FOREIGN PATENT DOCUMENTS

| JP | 54-145794 | 11/1979 |
| JP | 03-186847 | 8/1991 |
| JP | 05-005996 | 1/1993 |
| JP | 08-050354 | 2/1996 |
| JP | 2000-098601 | 4/2000 |
| JP | 2003-215802 | 7/2003 |

OTHER PUBLICATIONS

English translation of JP, 2003-215802, A (2003) from machine translation from AIPN Japan Patent Office National Center for Industrial Property Information and Training, generated Aug. 13, 2012, 10 pages.*

* cited by examiner

*Primary Examiner* — Cynthia Hamilton
(74) *Attorney, Agent, or Firm* — Ditthavong Mori & Steiner, P.C.

(57) ABSTRACT

A photosensitive insulating resin composition includes (A) an alkali-soluble resin that contains (a1) a structural unit derived from a crosslinkable monomer and (a2) a structural unit having a phenolic hydroxyl group, (B) a crosslinking agent, (C) a photosensitive compound, and (D) a solvent.

12 Claims, 1 Drawing Sheet

PHOTOSENSITIVE INSULATING RESIN COMPOSITION, CURED PRODUCT OF THE COMPOSITION, AND METHOD OF PRODUCING INSULATING FILM

CROSS-REFERENCE TO RELATED APPLICATIONS

This application claims priority under 35 U.S.C. §119 to Japanese Patent Application No. 2009-020665, filed Jan. 30, 2009 and Japanese Patent Application No. 2009-279870, filed Dec. 9, 2009. The contents of these applications are incorporated herein by reference in their entirety.

BACKGROUND OF THE INVENTION

1. Field of the Invention

The present invention relates to a photosensitive insulating resin composition, a cured product obtained by curing the photosensitive insulating resin composition, and a method of producing an insulating film.

2. Discussion of the Background

A polyimide resin that exhibits excellent heat resistance, mechanical properties, and the like has been widely used as an interlayer dielectric, a surface protective film, or the like that is used for semiconductor devices provided in electronic instruments. Various photosensitive polyimide resins provided with photosensitivity have been proposed in order to improve productivity, film formation accuracy, and the like. For example, Japanese Patent Application Publication (KOKAI) No. 5-5996 discloses a negative-tone resin in which a photo-crosslinkable group is introduced into a polyimide precursor via an ester bond or an ionic bond, and Japanese Patent Application Publication (KOKAI) No. 2000-98601 discloses a positive-tone resin that contains a polyimide precursor and an o-quinonediazide compound.

Along with an increase in the degree of integration of semiconductor devices, various photosensitive polyimide resins have been proposed in order to further improve the film formation accuracy. For example, Japanese Patent Application Publication (KOKAI) No. 54-145794 discloses a composition that contains a photosensitive polyimide resin in which a photo-crosslinkable group is introduced into a polyimide precursor via an ionic bond, and Japanese Patent Application Publication (KOKAI) No. 3-186847 discloses a composition that contains a photosensitive polyimide resin in which a photo-crosslinkable group is introduced into a polyimide precursor via an ester bond. Japanese Patent Application Publication (KOKAI) No. 8-50354 discloses a negative-tone photosensitive composition that contains an aromatic polyimide precursor and a polyfunctional acrylic compound. As a composition that does not contain a polyimide, Japanese Patent Application Publication (KOKAI) No. 2003-215802 discloses a photosensitive insulating resin composition that contains a phenolic hydroxyl group-containing alkali-soluble resin, a crosslinking agent, and a photoacid generator.

In the semiconductor field, the wafer size has been increased in order to improve yield. Therefore, the difference in coefficient of linear expansion between the wafer and an insulating film formed on the wafer has posed a problem. Specifically, when forming an insulating film on a wafer, the wafer is tensed by the insulating film that has a coefficient of linear expansion larger than that of the wafer. Since the wafer is tensed to a larger extent as the wafer size increases, the wafer is warped as a result of forming the insulating film on the wafer.

SUMMARY OF THE INVENTION

According to one aspect of the present invention, a photosensitive insulating resin composition includes (A) an alkali-soluble resin that contains (a1) a structural unit derived from a crosslinkable monomer and (a2) a structural unit having a phenolic hydroxyl group, (B) a crosslinking agent, (C) a photosensitive compound, and (D) a solvent.

According to another aspect of the present invention, a cured product is obtained by curing a photosensitive insulating resin composition. The photosensitive insulating resin composition includes (A) an alkali-soluble resin that contains (a1) a structural unit derived from a crosslinkable monomer and (a2) a structural unit having a phenolic hydroxyl group, (B) a crosslinking agent, (C) a photosensitive compound, and (D) a solvent.

According to still another aspect of the present invention, a method of producing an insulating film includes applying a photosensitive insulating resin composition to a substrate to form a film, exposing the film through a mask, heating the exposed film, developing the heated film, and heating the developed film. The photosensitive insulating resin composition includes (A) an alkali-soluble resin that contains (a1) a structural unit derived from a crosslinkable monomer and (a2) a structural unit having a phenolic hydroxyl group, (B) a crosslinking agent, (C) a photosensitive compound, and (D) a solvent.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
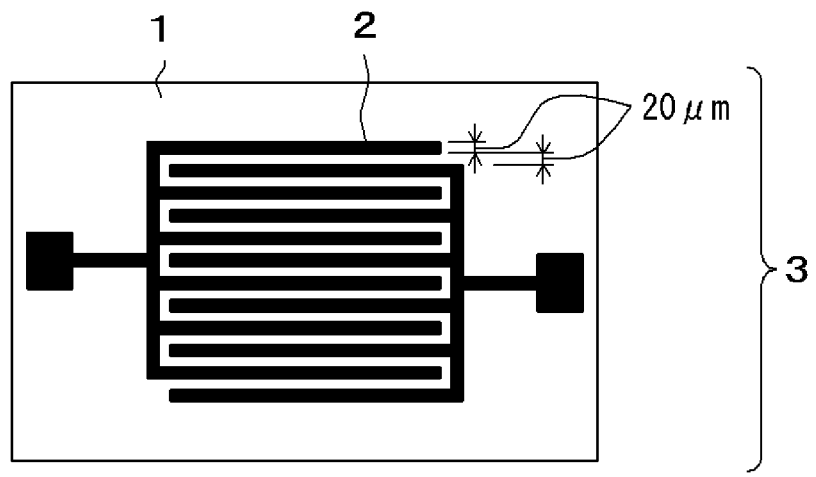
FIG. 1 is a schematic view illustrative of an electrical insulation evaluation substrate.

The embodiment of the present invention is described in detail below. Note that the term "(meth)acryl" used herein refers to "acryl" or "methacryl". The term "(meth)acrylate" used herein refers to "acrylate" or "methacrylate".

[1] Photosensitive Insulating Resin Composition

The photosensitive insulating resin composition according to the embodiment of the present invention includes (A) an alkali-soluble resin that contains (a1) a structural unit derived from a crosslinkable monomer and (a2) a structural unit having a phenolic hydroxyl group (hereinafter may be referred to as "alkali-soluble resin (A)" or "resin (A)"), (B) a crosslinking agent (hereinafter may be referred to as "crosslinking agent (B)"), (C) a photosensitive compound (hereinafter may be referred to as "photosensitive compound (C)"), and (D) a solvent (hereinafter may be referred to as "solvent (D)").

Alkali-Soluble Resin (A)

The resin (A) is an alkali-soluble resin that contains the structural unit (a1) derived from a crosslinkable monomer (hereinafter may be simply referred to as "structural unit (a1)") and the structural unit (a2) having a phenolic hydroxyl group (hereinafter may be simply referred to as "structural unit (a2)").

The expression "alkali-soluble" used herein refers to a case where the resin (A) can be dissolved in 100 parts by mass of a 2.38 mass % tetrahydroammonium hydroxide aqueous solution in an amount of at least 10 parts by mass.

The structural unit (a1) is derived from a crosslinkable monomer. The term "crosslinkable monomer" used herein refers to a monomer having at least two polymerizable unsaturated bonds. Specifically, the term "crosslinkable monomer" used herein refers to a monomer that has at least two polymerizable unsaturated bonds and forms a crosslinked structure in the resin (A) upon cleavage of the polymerizable unsaturated bonds. When a crosslinked structure is formed in the resin (A), the elongation capability of the resulting insulating film is improved while suppressing warping of the insulating film. Moreover, since the resin (A) can maintain sufficient alkali-solubility even when the resin (A) has a high molecular weight, the resolution of the resin (A) can be maintained.

Examples of the crosslinkable monomer include compounds having a plurality of polymerizable unsaturated groups, such as p-divinylbenzene, m-divinylbenzene, o-divinylbenzene, diallyl phthalate, ethylene glycol di(meth)acrylate, propylene glycol di(meth)acrylate, trimethylolpropane tri(meth)acrylate, pentaerythritol tri(meth)acrylate, polyethylene glycol di(meth)acrylate, and polypropylene glycol di(meth)acrylate; polyethylene glycol divinyl ethers such as triethylene glycol divinyl ether; compounds shown by the following formulas (x1) to (x4); and compounds shown by the following general formula (y). Further examples of the crosslinkable monomer include commercially available products such as "RAPI-CURE DVE-3" (manufactured by ISP Japan, Ltd.). Among these, p-divinylbenzene, m-divinylbenzene, o-divinylbenzene, and triethylene glycol divinyl ether are preferable from the viewpoint of elongation and warping.

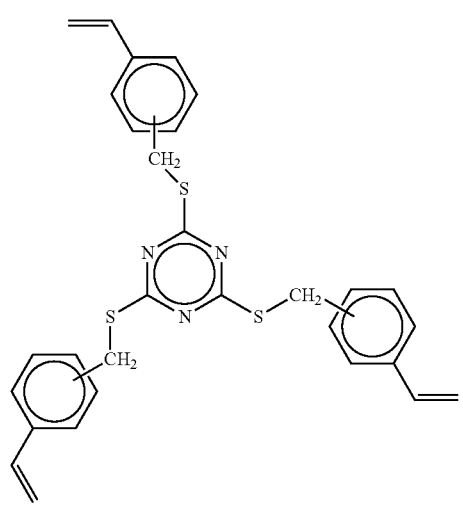

(x1)

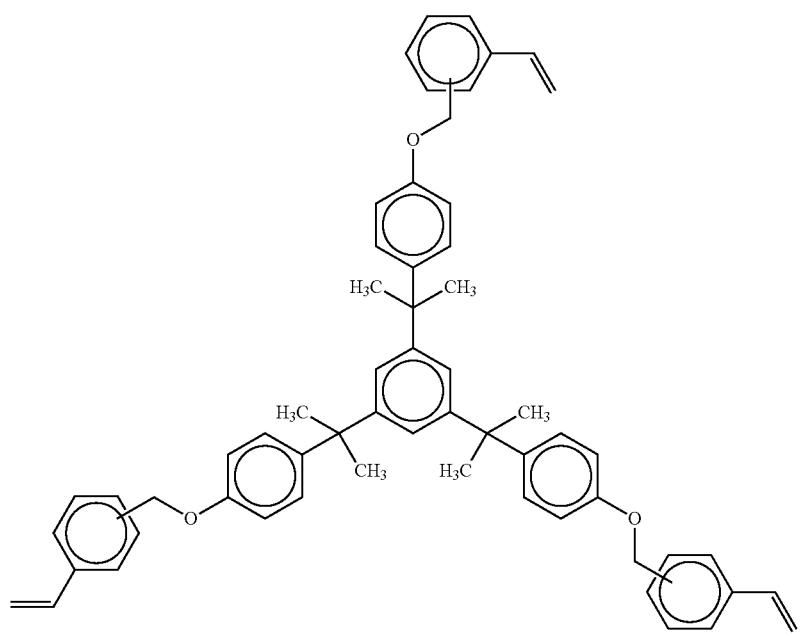

(x2)

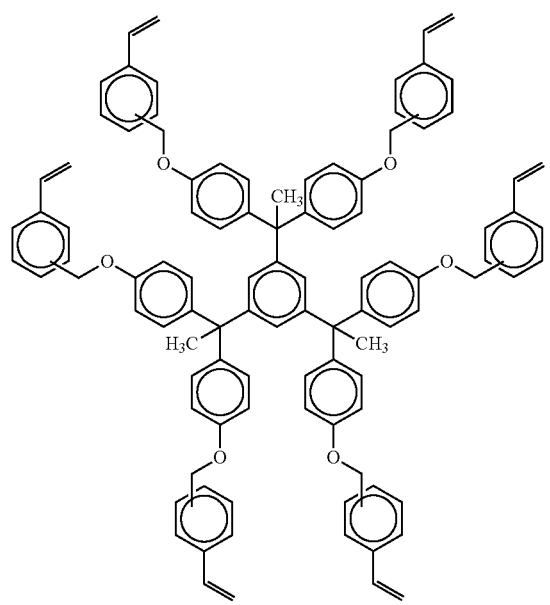
(x3)
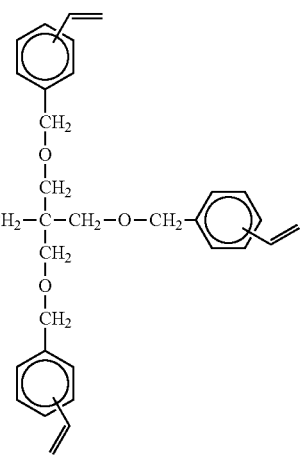
(x4)
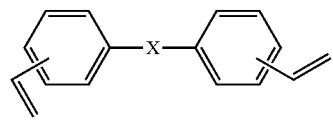
(y)
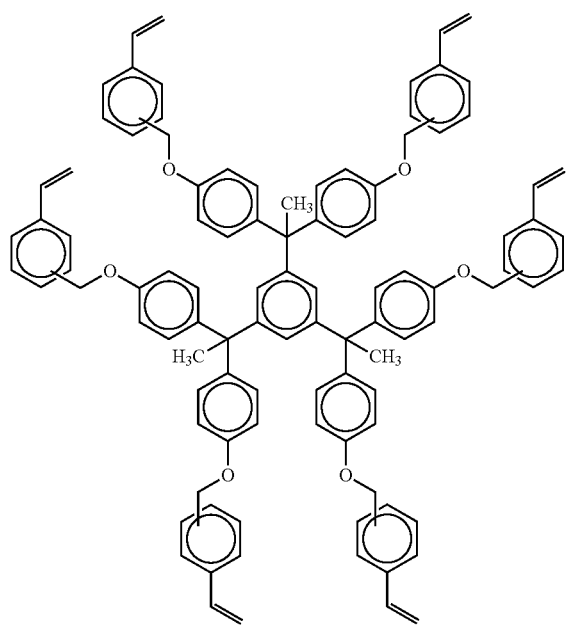
(x3)

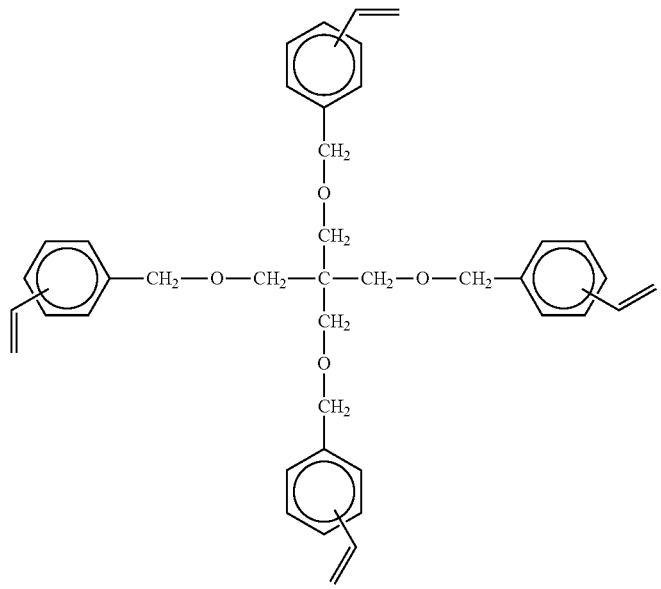
(x4)

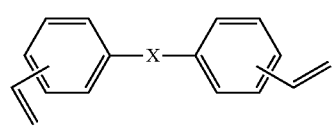

wherein X represents a divalent organic group.

Examples of the divalent organic group represented by X in the general formula (y) include —O—, —S—, an alkylene group, an alkenylene group, an arylene group, —N(Ra)—, —C=(O)—O—, —C(Rb)=N—, —C=(O)—, a sulfonyl group, a heterocyclic group, a divalent organic group formed by two or more of these groups, and the like. Note that Ra and Rb represent a hydrogen atom, an alkyl group, or an aryl group. These divalent organic groups may be substituted with an alkyl group, an aryl group, a halogen atom, or the like.

Examples of the heterocyclic group that may be included in the divalent organic group include nitrogen-containing heterocyclic rings such as a pyrrole ring, a pyrazole ring, an imidazole ring, a triazole ring, a tetrazole ring, an isoxazole ring, an oxazole ring, an oxadiazole ring, an isothiazole ring, a thiazole ring, a thiadiazole ring, a thiatriazole ring, an indole ring, an indazole ring, a benzimidazole ring, a benzotriazole ring, a benzoxazole ring, a benzothiazole ring, a benzoselenazole ring, a benzothiadiazole ring, a pyridine ring, a pyridazine ring, a pyrimidine ring, a pyrazine ring, a triazine ring, a quinoline ring, and a quinoxaline ring, a furan ring, a thiophene ring, and the like. These heterocyclic groups may be substituted with an alkyl group, an aryl group, a halogen atom, or the like.

Specific examples of the compounds shown by the general formula (y) include compounds shown by the following formulas (y1) to (y7).

(y)

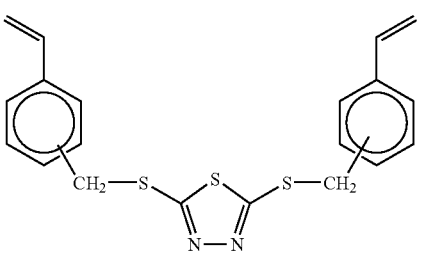
(y1)

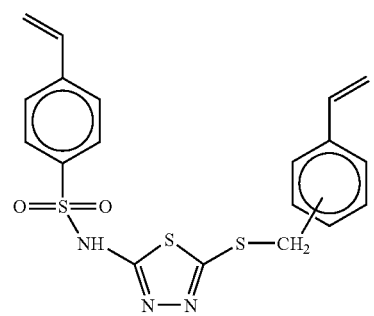
(y2)

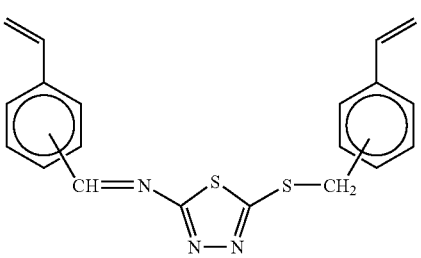
(y3)

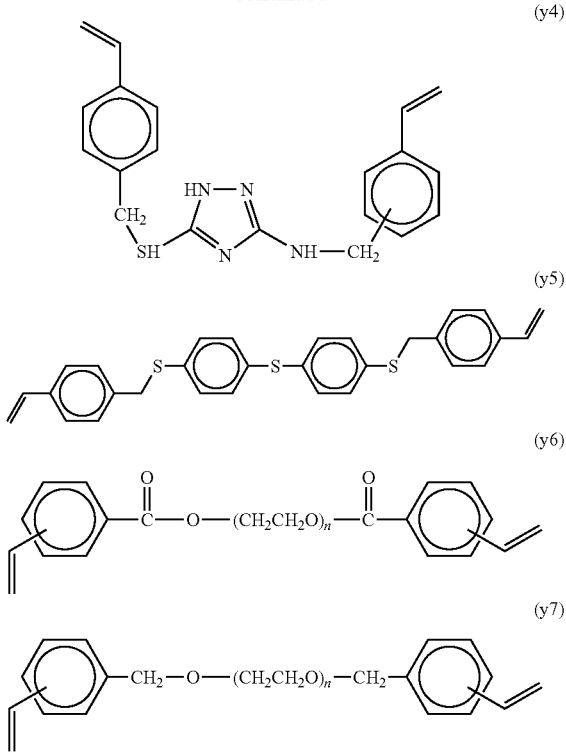

wherein n represents an integer from 1 to 50.

In the embodiment of the present invention, it is preferable that the structural unit (a1) be a structural unit derived from divinylbenzene, a structural unit derived from the compound shown by the general formula (y), or a structural unit derived from triethylene glycol divinyl ether, since warping and elongation can be suppressed more sufficiently. In this case, two polymerizable unsaturated bonds included in divinylbenzene, the compound shown by the general formula (y), or triethylene glycol divinyl ether have been cleaved.

The resin (A) may contain only one type of structural unit (a1), or may contain two or more types of structural units (a1).

The structural unit (a2) is not particularly limited insofar as the structural unit (a2) has a phenolic hydroxyl group, but is preferably a hydroxystyrene unit (i.e., a unit produced by cleavage of a polymerizable unsaturated bond of hydroxystyrene), an isopropenylphenol unit (i.e., a unit produced by cleavage of a polymerizable unsaturated bond of isopropenylphenol), or the like. The structural unit (a2) suppresses warping and elongation while maintaining sufficient resolution.

Examples of the monomer that may form the structural unit (a2) include phenolic hydroxyl group-containing compounds such as p-isopropenylphenol, m-isopropenylphenol, o-isopropenylphenol, p-hydroxystyrene, m-hydroxystyrene, and o-hydroxystyrene. Among these, p-isopropenylphenol and p-hydroxystyrene are preferable.

The structural unit (a2) may also be obtained from a monomer in which a phenolic hydroxyl group is protected by a t-butyl group, an acetal group, or the like. The resulting polymer or copolymer may be deprotected by a known method (e.g., deprotected in the presence of an acid catalyst) to obtain a structural unit having a phenolic hydroxyl group.

Examples of the monomer having a protected phenolic hydroxyl group include hydroxystyrene protected by an acetal group (e.g., p-1-methoxyethoxystyrene and p-1-ethoxyethoxystyrene), t-butoxystyrene, t-buthoxycarbonyloxystyrene, acetoxystyrene, and the like.

The resin (A) may contain only one type of structural unit (a2), or may contain two or more types of structural units (a2).

The resin (A) used in the embodiment of the present invention may contain (a3) a structural unit derived from another monomer (hereinafter may be simply referred to as "structural unit (a3)") in addition to the structural units (a1) and (a2).

Examples of the monomer that may form the structural unit (a3) include styrenes such as styrene, α-methylstyrene, o-methylstyrene, m-methylstyrene, p-methylstyrene, o-methoxystyrene, m-methoxystyrene, and p-methoxystyrene; unsaturated carboxylic acids and anhydrides thereof, such as (meth) acrylic acid, maleic acid, fumaric acid, crotonic acid, mesaconic acid, citraconic acid, itaconic acid, maleic anhydride, and citraconic anhydride; esters (e.g., methyl ester, ethyl ester, n-propyl ester, i-propyl ester, n-butyl ester, i-butyl ester, sec-butyl ester, t-butyl ester, n-amyl ester, n-hexyl ester, cyclohexyl ester, 2-hydroxyethyl ester, 2-hydroxypropyl ester, 3-hydroxypropyl ester, 2,2-dimethyl-3-hydroxypropyl ester, benzyl ester, isoboronyl ester, tricyclodecanyl ester, and 1-adamantyl ester) of unsaturated carboxylic acids; unsaturated nitriles such as (meth)acrylonitrile, maleinitrile, fumaronitrile, mesaconitrile, citraconitrile, and itaconitrile; unsaturated amides such as (meth)acrylamide, crotonamide, maleinamide, fumaramide, mesaconamide, citraconamide, and itaconamide; unsaturated imides such as maleimide, N-phenylmaleimide, and N-cyclohexylmaleimide; alicyclic skeleton-containing compounds such as bicyclo[2.2.1]hept-2-ene (norbornene), tetracyclo[4.4.0.1$^{2,5}$.1$^{7,10}$]dodec-3-ene, cyclobutene, cyclopentene, cyclooctene, dicyclopentadiene, and tricyclo[5.2.1.0$^{2,6}$]decene; unsaturated alcohols such as (meth)allyl alcohol, N-vinylaniline, vinylpyridines, N-vinyl-∈-caprolactam, N-vinylpyrrolidone, N-vinylimidazole, N-vinylcarbazole, and the like.

Among these, styrene and p-methoxystyrene are preferable.

The resin (A) may contain only one type of structural unit (a3), or may contain two or more types of structural units (a3).

From the viewpoint of warping, elongation, and resolution, the resin used in the embodiment of the present invention (A) is preferably (1) a resin that contains a structural unit derived from divinylbenzene as the structural unit (a1) and a hydroxystyrene unit as the structural unit (a2), and is obtained using divinylbenzene, a monomer that produces the hydroxystyrene unit, and another monomer, (2) a resin that contains a structural unit derived from divinylbenzene as the structural unit (a1) and a hydroxystyrene unit as the structural unit (a2), and is obtained using divinylbenzene and a monomer that produces the hydroxystyrene unit, (3) a resin that contains a structural unit derived from triethylene glycol divinyl ether as the structural unit (a1) and a hydroxystyrene unit as the structural unit (a2), and is obtained using triethylene glycol divinyl ether, a monomer that produces the hydroxystyrene unit, and another monomer, or (4) a resin that contains a structural unit derived from triethylene glycol divinyl ether as the structural unit (a1) and a hydroxystyrene unit as the structural unit (a2), and is obtained using triethylene glycol divinyl ether and a monomer that produces the hydroxystyrene unit.

The total content of the structural units (a1) and (a2) in the resin (A) is preferably 50 to 100 mol %, more preferably 60 to 100 mol %, and still more preferably 90 to 100 mol %, based on the total content (=100 mol %) of the structural units that form the resin (A). If the total content of the structural units (a1) and (a2) is 50 to 100 mol %, it is possible to form a cured product (e.g., insulating film) that exhibits excellent resolution, sensitivity, electrical insulating properties, and the like, while sufficiently suppressing warping and elongation of a substrate when forming an insulating film.

The molar ratio ((a1)/(a2)) of the structural unit (a1) to the structural unit (a2) is preferably 0.001 to 10, more preferably 0.01 to 5, and still more preferably 0.01 to 1. If the molar ratio is 0.001 to 10, excellent alkali developability is obtained. Moreover, since a stress applied to the resulting insulating film can be sufficiently reduced, warping of a wafer can be suppressed.

The content of the structural unit (a3) in the resin (A) is preferably 50 mol % or less, more preferably 0 to 40 mol %, and still more preferably 0 to 10 mol %, based on the total content (=100 mol %) of the structural units that form the resin (A). If the content of the structural unit (a3) is 50 mol % or less, it is possible to form a cured product (e.g., insulating film) that exhibits excellent resolution, sensitivity, electrical insulating properties, and the like, while sufficiently suppressing warping and elongation of a substrate when forming an insulating film.

The polystyrene-reduced weight average molecular weight (Mw) of the resin (A) determined by gel permeation chromatography is not particularly limited, but is preferably 10,000 to 300,000, more preferably 10,000 to 150,000, and still more preferably 20,000 to 110,000, from the viewpoint of the resolution, thermal shock resistance, heat resistance, and residual percentage of the resulting insulating film.

It is preferable that the resin (A) have a glass transition temperature (Tg) of more than 0° C.

The resin (A) may be produced by radical polymerization, for example.

Examples of the polymerization method include emulsion polymerization, suspension polymerization, solution polymerization, bulk polymerization, and the like. Among these, solution polymerization is preferable.

A radical polymerization initiator may be used when producing the resin (A). Examples of the radical polymerization initiator include azo compounds such as 2,2'-azobisisobutylonitrile, 2,2'-azobis-(2,4-dimethylvaleronitrile), 2,2'-azobis-(4-methoxy-2,4-dimethylvaleronitrile), 2,2'-azobis(2-methylbutyronitrile), 1,1'-azobis-(cyclohexane-1-carbonitrile), and dimethyl-2,2'-azobis(2-methyl propionate); organic peroxides such as benzoyl peroxide, lauroyl peroxide, t-butyl peroxypivalate, and 1,1'-bis-(t-butylperoxy)cyclohexane; hydrogen peroxide; and the like. When using an organic peroxide as the radical polymerization initiator, a reducing agent may be used in combination with the organic peroxide (i.e., redox initiator).

A polymerization solvent used when producing the resin (A) is not particularly limited insofar as the polymerization solvent does not react with the monomers and dissolves a polymer produced.

Examples of the polymerization solvent include alcohols such as methanol, ethanol, ethylene glycol, diethylene glycol, and propylene glycol; cyclic ethers such as tetrahydrofuran and dioxane; polyhydric alcohol alkyl ethers such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; polyhydric alcohol alkyl ether acetates such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; and esters such as ethyl acetate, butyl acetate, ethyl 2-hydroxypropionate, ethyl 2-hydroxy-2-methylpropionate, ethyl 2-hydroxy-2-methylpropionate, ethoxyethyl acetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, and ethyl lactate.

Among these, the cyclic ethers, polyhydric alcohol alkyl ethers, polyhydric alcohol alkyl ether acetates, ketones, and esters are preferable.

In the photosensitive insulating resin composition according to the embodiment of the present invention, the resin (A) may be used either individually or in combination.

Crosslinking Agent (B)

The crosslinking agent (B) used in the embodiment of the present invention is not particularly limited insofar as the crosslinking agent (B) undergoes a crosslinking reaction optionally with another component (e.g., resin (A)) due to an external stimulus (e.g., heat or acid) to form a three-dimensional crosslinked structure.

Examples of the crosslinking agent (B) include (b1) a compound that contains two or more alkyl-etherified amino groups in the molecule (hereinafter referred to as "amino group-containing compound"); (b2) an oxirane ring-containing compound; (b3) an oxetanyl ring-containing compound; an isocyanate group-containing compound (including a block compound); an aldehyde group-containing phenol compound such as o-hydroxybenzaldehyde; a methylol group-containing phenol compound such as 2,6-bis(hydroxymethyl)-p-cresol; and the like. It is preferable to use at least one compound selected from the amino group-containing compound (b1), the oxirane ring-containing compound (b2), and the oxetanyl ring-containing compound (b3).

The crosslinking agent (B) is appropriately selected depending on the type (positive tone or negative tone) of the composition, the composition of each component, and the like. These crosslinking agents (B) may be used either individually or in combination.

Examples of the amino group-containing compound (b1) include, but are not limited to, a compound obtained by alkyl-etherification of all or some (at least two) of the active methylol groups ($CH_2OH$ groups) of a nitrogen-containing compound (e.g., (poly)methylol melamine, (poly)methylol glycoluril, (poly)methylol benzoquanamine, or (poly)methylol urea). Examples of the alkyl group that forms the alkyl ether include a methyl group, an ethyl group, and a butyl group. The alkyl groups may be the same or different. A methylol group that is not alkyl etherified may be self-condensed in one molecule, or may be condensed across two molecules to form an oligomer component. Specifically, hexamethoxymethyl melamine, hexabutoxymethyl melamine, tetramethoxymethyl glycoluril, tetrabutoxymethyl glycoluril, or the like may be used.

If the photosensitive insulating resin composition contains the amino group-containing compound (b1), an insulating film that exhibits excellent resolution and chemical resistance is obtained.

The oxirane ring-containing compound (b2) is not particularly limited insofar as the compound contains an oxirane ring in the molecule. Examples of the oxirane ring-containing compound (b2) include a phenol novolac epoxy resin, a cresol novolac epoxy resin, a bisphenol epoxy resin, a trisphenol epoxy resin, a tetraphenol epoxy resin, a phenol-xylylene epoxy resin, a naphthol-xylylene epoxy resin, a phenol-naphthol epoxy resin, a phenol-dicyclopentadiene epoxy resin, an alicyclic epoxy resin, an aliphatic epoxy resin, and the like.

If the photosensitive insulating resin composition contains the oxirane ring-containing compound (b2), an insulating film that exhibits excellent resolution and chemical resistance is obtained.

The oxetanyl ring-containing compound (b3) is not particularly limited insofar as the compound contains an oxetanyl ring in the molecule. Examples of the oxetanyl ring-containing compound (b3) include compounds shown by the following formula (b3-1), compounds shown by the following formula (b3-2), compounds shown by the following formula (b3-3), and the like.

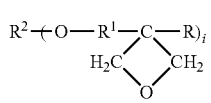

(b3-1)

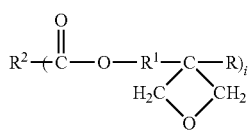

(b3-2)

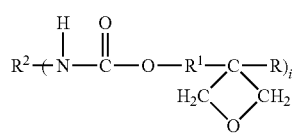

(b3-3)

wherein R represents an alkyl group (e.g., methyl group, ethyl group, or propyl group), $R^1$ represents an alkylene group (e.g., methylene group, ethylene group, or propylene group), $R^2$ represents an alkyl group (e.g., methyl group, ethyl group, propyl group, or hexyl group), an aryl group (e.g., phenyl group or xylyl group), a dimethylsiloxane residue shown by the following formula (i), an alkylene group (e.g., methylene group, ethylene group, or propylene group), a phenylene group, or the group shown by any of the following formulas (ii) to (vi), and i is equal to the valence of $R^2$ (i.e., an integer from 1 to 4).

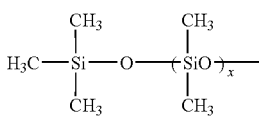

(i)

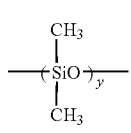

(ii)

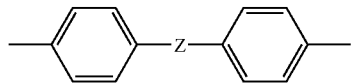

(iii)

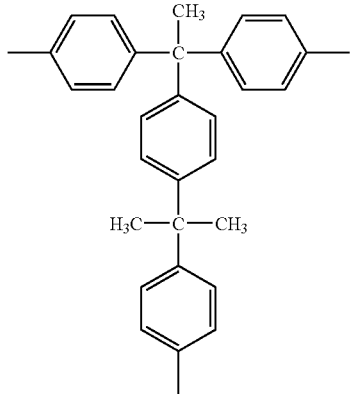

(iv)

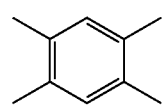

(v)

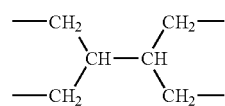

(vi)

x in the formula (i) represents an integer from 0 to 50, and y in the formula (ii) represents an integer from 1 to 50.

Z in the formula (iii) represents a single bond or a divalent group shown by —$CH_2$—, —$C(CH_3)_2$—, —$C(CF_3)_2$—, or —$SO_2$—.

Specific examples of the compounds shown by the formulas (b3-1) to (b3-3) include 1,4-bis{[(3-ethyloxetane-3-yl)methoxyl}methyl]benzene ("OXT-121" manufactured by Toagosei Co., Ltd.), 3-ethyl-3-{[((3-ethyloxetane-3-yl)methoxy]methyl}oxetane ("OXT-221" manufactured by Toagosei Co., Ltd.), 4,4'-bis[(3-ethyl-3-oxetanyl)methoxymethyl]biphenyl ("ETERNACOLL OXBP" manufactured by Ube Industries, Ltd.), bis[(3-ethyl-3-oxetanylmethoxy)methyl-phenyl]ether, bis[(3-ethyl-3-oxetanylmethoxy)methyl-phenyl]propane, bis[(3-ethyl-3-oxetanylmethoxy)methyl-phenyl]sulfone, bis[(3-ethyl-3-oxetanylmethoxy)methyl-phenyl]ketone, bis[(3-ethyl-3-oxetanylmethoxy)methyl-phenyl]hexafluoropropane, bis[(3-ethyl-3-oxetanylmethoxy)methyl]benzene, tetra[(3-ethyl-3-oxetanylmethoxy)methyl]benzene, the compounds shown by the following formulas (b3-4) and (b3-6) to (b3-8), and the like.

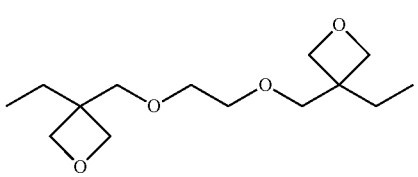

(b3-4)

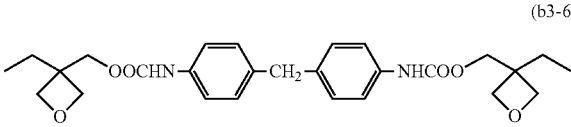

(b3-6)

-continued

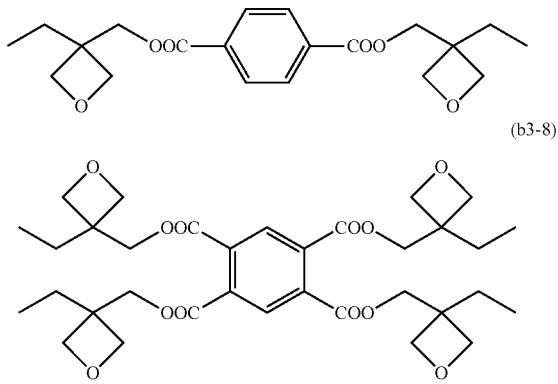

(b3-7)

(b3-8)

Note that the oxetanyl ring-containing compound (b3) is not limited to the above compounds. For example, an oxetane oligomer ("Oligo-OXT" manufactured by Toagosei Co., Ltd.), and the compounds shown by the following formulas (b3-9) and (b3-10) may also be used.

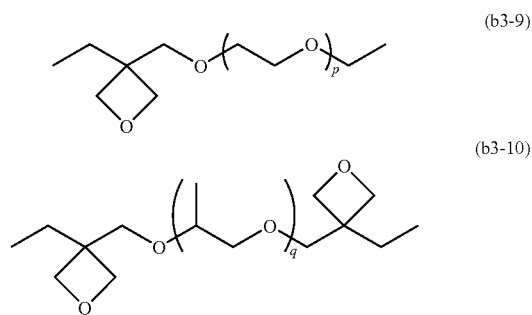

(b3-9)

(b3-10)

wherein p, q, and s individually represent integers from 0 to 10,000.

Among the above oxetanyl ring-containing compounds (b3), 1,4-bis{[(3-ethyloxetane-3-yl)methoxy]methyl}benzene ("OXT-121" manufactured by Toagosei Co., Ltd.), 3-ethyl-3-{[(3-ethyloxetane-3-yl)methoxy]methyl}oxetane ("OXT-221" manufactured by Toagosei Co., Ltd.), and 4,4'-bis[(3-ethyl-3-oxetanyl)methoxymethyl]biphenyl ("ETERNACOLL OXBP" manufactured by Ube Industries, Ltd.) are preferable.

If the photosensitive insulating resin composition contains the oxetanyl ring-containing compound (b3), an insulating film that exhibits excellent resolution and chemical resistance is obtained.

It is preferable to use the amino group-containing compound (b1) or the oxirane ring-containing compound (b2) as the crosslinking agent (B). The amino group-containing compound (b1) and the oxirane ring-containing compound (b2) may be used in combination as the crosslinking agent (B). When using the amino group-containing compound (b1) and the oxirane ring-containing compound (b2) in combination, the oxirane ring-containing compound (b2) is preferably used in an amount of 50 mass % or less, and more preferably 5 to 40 mass %, based on the total amount (=100 mass %) of the amino group-containing compound (b1) and the oxirane ring-containing compound (b2). In this case, a cured film (e.g., insulating film) that exhibits excellent chemical resistance can be obtained without impairing resolution.

The content of the crosslinking agent (B) is preferably 1 to 100 parts by mass, and more preferably 5 to 50 parts by mass, based on 100 parts by mass of the resin (A). If the content of the crosslinking agent (B) is 1 to 100 parts by mass, a curing reaction proceeds sufficiently so that the resulting insulating film has an excellent pattern shape with high resolution and exhibits excellent heat resistance, electrical insulating properties, and the like.

Photosensitive Compound (C)

The photosensitive compound (C) used in the embodiment of the present invention is not particularly limited insofar as the photosensitive compound (C) is a compound (acid generator) that generates an acid upon exposure to radiation.

When the photosensitive insulating resin composition according to the embodiment of the present invention is a negative-tone resin composition, examples of the photosensitive compound (C) include onium salt compounds, halogen-containing compounds, diazoketone compounds, sulfone compounds, sulfonic acid compounds, sulfonimide compounds, diazomethane compounds, and the like (hereinafter may be referred to as "photoacid generator (C1)" or "acid generator (C1)").

The photoacid generator (C1) generates an acid upon exposure to radiation or the like. The acid catalyzes a reaction (including dealcoholization) of an alkyl ether group contained in the crosslinking agent (B) with a phenol ring contained in the resin (A) or a phenolic low-molecular-weight compound so that a negative-tone pattern is formed.

When the composition according to the embodiment of the present invention is a negative-tone resin composition, a negative-tone pattern can be formed while sufficiently suppressing warping and elongation of a substrate when forming an insulating film or the like. Moreover, it is possible to form a cured product (e.g., insulating film) that exhibits excellent resolution, electrical insulating properties, and the like.

Examples of the onium salt compounds include an iodonium salt, a sulfonium salt, a phosphonium salt, a diazonium salt, a pyridinium salt, and the like. Specific examples of preferable onium salts include diphenyliodonium trifluoromethanesulfonate, diphenyliodonium p-toluenesulfonate, diphenyliodonium hexafluoroantimonate, diphenyliodonium hexafluorophosphate, diphenyliodonium tetrafluoroborate, triphenylsulfonium trifluoromethanesulfonate, triphenylsulfonium p-toluenesulfonate, triphenylsulfonium hexafluoroantimonate, 4-t-butylphenyl.diphenylsulfonium trifluoromethanesulfonate, 4-t-butylphenyl.diphenylsulfonium p-toluenesulfonate, 4,7-di-n-butoxynaphthyltetrahydrothiophenium trifluoromethanesulfonate, 4-(phenylthio)phenyldiphenylsulfonium tris(pentafluoroethyl)trifluorophosphate, and the like.

Examples of the halogen-containing compounds include haloalkyl group-containing hydrocarbon compounds, haloalkyl group-containing heterocyclic compounds, and the like. Specific examples of preferable halogen-containing compounds include 1,10-dibromo-n-decane, 1,1-bis(4-chlorophenyl)-2,2,2-trichloroethane, and s-triazine derivatives such as phenyl-bis(trichloromethyl)-s-triazine, 4-methoxyphenyl bis(trichloromethyl)-s-triazine, styryl bis(trichloromethyl)-s-triazine, naphtyl-bis(trichloromethyl)-s-triazine, 2-[2-(furan-2-yl)ethenyl]-4,6-bis(trichloromethyl)-s-triazine, and 2-[2-(5-methylfuran-2-yl)ethenyl]-4,6-bis(trichloromethyl)-s-triazine.

Examples of the diazoketone compounds include 1,3-diketo-2-diazo compounds, diazobenzoquinone compounds, and diazonaphthoquinone compounds. Specific examples of the diazoketone compounds include a 1,2-naphthoquinonediazido-4-sulfonate compound of a phenol and the like.

Examples of the sulfone compounds include a β-ketosulfone compound, a β-sulfonylsulfone compound, an α-diazo compound of these compounds, and the like. Specific examples of the sulfone compounds include 4-trisphenacylsulfone, mesitylphenacylsulfone, bis(phenacylsulfonyl)methane, and the like.

Examples of the sulfonic acid compounds include an alkyl sulfonate, a haloalkyl sulfonate, an aryl sulfonate, an iminosulfonate, and the like. Specific examples of preferable sulfonic acid compounds include benzointocylate, pyrogallol tristrifluoromethanesulfonate, o-nitrobenzyl trifluoromethanesulfonate, o-nitrobenzyl p-toluenesulfonate, and the like.

Specific examples of the sulfonimide compounds include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboxylmide, N-(trifluoromethylsulfonyloxy)naphthylimide, and the like.

Specific examples of the diazomethane compounds include bis(trifluoromethylsulfonyl)diazomethane, bis(cyclohexylsulfonyl)diazomethane, bis(phenylsulfonyl)diazomethane, and the like.

It is preferable to use the onium salt compound as the acid generator (C1). Among the onium salt compounds, a hydroxyl group-containing onium salt compound is preferable.

These acid generators (C1) may be used either individually or in combination.

The content of the acid generator (C1) is preferably 0.1 to 10 parts by mass, and more preferably 0.3 to 5 parts by mass, based on 100 parts by mass of the resin (A) or a phenolic low-molecular-weight compound, from the viewpoint of ensuring sensitivity, resolution, pattern shape, and the like. If the content of the acid generator (C1) is less than 0.1 parts by mass, the composition may not be sufficiently cured so that heat resistance may decrease. If the content of the acid generator (C1) is more than 10 parts by mass, radiation transmittance may decrease so that the pattern shape may deteriorate.

When the photosensitive insulating resin composition according to the embodiment of the present invention is a positive-tone composition, a quinonediazide group-containing compound is preferably used as the acid generator (C) (hereinafter may be referred to as "acid generator (C2)").

When the composition according to the embodiment of the present invention is a positive-tone resin composition, a positive-tone pattern can be formed so that a cured product (e.g., insulating film) that exhibits excellent resolution, electrical insulating properties, and the like can be formed. Moreover, it is possible to sufficiently suppress warping and elongation of a substrate when forming an insulating film.

The term "quinonediazide group-containing compound" refers to an ester compound of a compound that has at least one phenolic hydroxyl group and 1,2-naphthoquinonediazido-4-sulfonic acid or 1,2-naphthoquinonediazido-5-sulfonic acid.

The compound that has at least one phenolic hydroxyl group is not particularly limited, but is preferably a compound that has a structure shown by any of the following formulas (c2-1) to (c2-5).

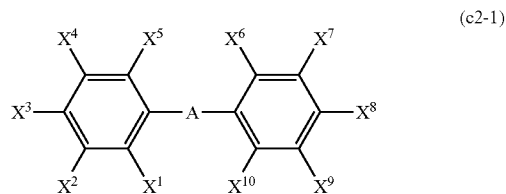

(c2-1)

wherein $X^1$ to $X^{10}$ individually represent a hydrogen atom, an alkyl group having 1 to 4 carbon atoms, an alkoxy group having 1 to 4 carbon atoms, or a hydroxyl group, provided that at least one of $X^1$ to $X^5$ represents a hydroxyl group, and A represents a single bond, O, S, $CH_2$, $C(CH_3)_2$, $C(CF_3)_2$, C=O, or $SO_2$.

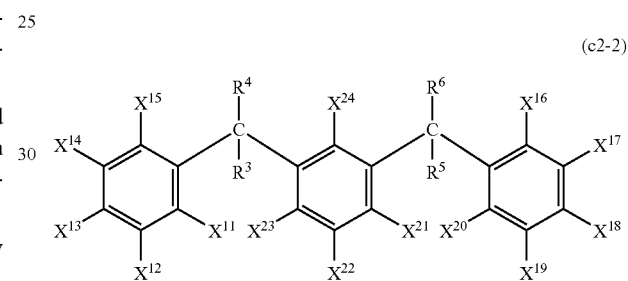

(c2-2)

wherein $X^{11}$ to $X^{24}$ individually represent a hydrogen atom, an alkyl group having 1 to 4 carbon atoms, an alkoxy group having 1 to 4 carbon atoms, or a hydroxyl group, provided that at least one of $X^{11}$ to $X^{15}$ represents a hydroxyl group, and $R^3$ to $R^6$ individually represent a hydrogen atom or an alkyl group having 1 to 4 carbon atoms.

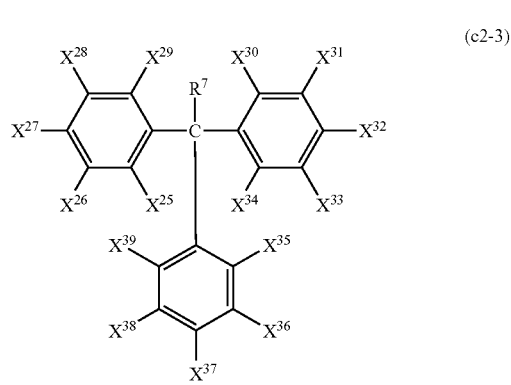

(c2-3)

wherein $X^{25}$ to $X^{39}$ individually represent a hydrogen atom, an alkyl group having 1 to 4 carbon atoms, an alkoxy group having 1 to 4 carbon atoms, or a hydroxyl group, provided that at least one of $X^{25}$ to $X^{29}$ and at least one of $X^{30}$ to $X^{34}$ represents a hydroxyl group, and $R^7$ represents a hydrogen atom or an alkyl group having 1 to 4 carbon atoms.

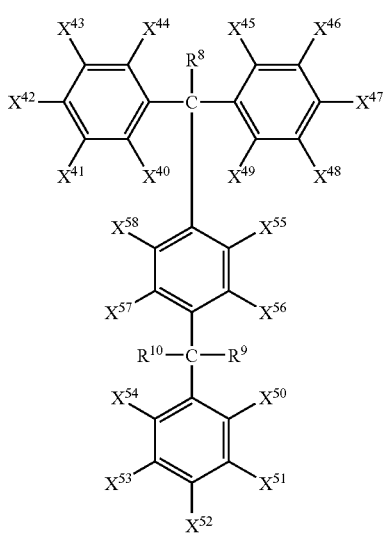

(c2-4)

wherein $X^{40}$ to $X^{58}$ individually represent a hydrogen atom, an alkyl group having 1 to 4 carbon atoms, an alkoxy group having 1 to 4 carbon atoms, or a hydroxyl group, provided that at least one of $X^{40}$ to $X^{44}$, at least one of $X^{45}$ to $X^{49}$, and at least one of $X^{50}$ to $X^{54}$ represents a hydroxyl group, and $R^8$ to $R^{19}$ individually represent a hydrogen atom or an alkyl group having 1 to 4 carbon atoms.

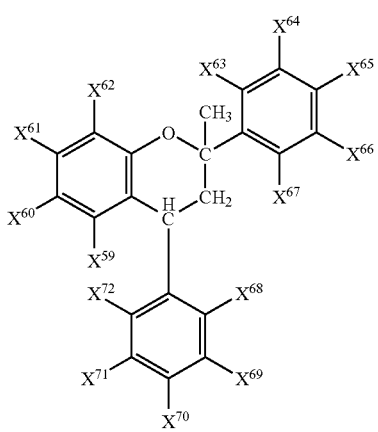

(c2-5)

wherein $X^{59}$ to $X^{72}$ individually represent a hydrogen atom, an alkyl group having 1 to 4 carbon atoms, an alkoxy group having 1 to 4 carbon atoms, or a hydroxyl group, provided that at least one of $X^{59}$ to $X^{62}$ and at least one of $X^{63}$ to $X^{67}$ represents a hydroxyl group.

Specific examples of the quinonediazide group-containing compound include an ester compound of 1,2-naphthoquinonediazido-4-sulfonic acid or 1,2-naphthoquinonediazido-5-sulfonic acid and 4,4'-dihydroxydiphenylmethane, 4,4'-dihydroxydiphenyl ether, 2,3,4-trihydroxybenzophenone, 2,3,4,4'-tetrahydroxybenzophenone, 2,3,4,2',4'-pentahydroxybenzophenone, tris(4-hydroxyphenyl)methane, tris(4-hydroxyphenyl)ethane, 1,1-bis(4-hydroxyphenyl)-1-phenylethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, 1,1-bis(4-hydroxyphenyl)-1-[4-{1-(4-hydroxyphenyl)-1-methylethyl}phenyl]ethane, or the like. These quinonediazide group-containing compounds may be used either individually or in combination.

The content of the acid generator (C2) is not particularly limited, but is preferably 10 to 50 parts by mass, and more preferably 15 to 30 parts by mass, based on 100 parts by mass of the resin (A). If the content of the acid generator (C2) is less than 10 parts by mass, the residual percentage in an unexposed area may decrease, or an image conforming to the mask pattern may not be formed. If the content of the acid generator (C2) is more than 50 parts by mass, the pattern shape may deteriorate, or foaming may occur during curing.

Solvent (D)

The solvent (D) is used in the photosensitive insulating resin composition according to the embodiment of the present invention to improve the handling capability of the resin composition and adjust the viscosity and the storage stability of the resin composition.

Examples of the solvent (D) include, but are not limited to, ethylene glycol monoalkyl ether acetates such as ethylene glycol monomethyl ether acetate and ethylene glycol monoethyl ether acetate; propylene glycol monoalkyl ethers such as propylene glycol monomethyl ether, propylene glycol monoethyl ether, propylene glycol monopropyl ether, and propylene glycol monobutyl ether; propylene glycol dialkyl ethers such as propylene glycol dimethyl ether, propylene glycol diethyl ether, propylene glycol dipropyl ether, and propylene glycol dibutyl ether; propylene glycol monoalkyl ether acetates such as propylene glycol monomethyl ether acetate, propylene glycol monoethyl ether acetate, propylene glycol monopropyl ether acetate, and propylene glycol monobutyl ether acetate; cellosolves such as ethyl cellosolve and butyl cellosolve; carbitols such as butyl carbitol; lactates such as methyl lactate, ethyl lactate, n-propyl lactate, and isopropyl lactate; aliphatic carboxylates such as ethyl acetate, n-propyl acetate, n-butyl acetate, i-butyl acetate, n-amyl acetate, i-amyl acetate, i-propyl propionate, n-butyl propionate, and i-butyl propionate; other esters such as methyl 3-methoxypropionate, ethyl 3-methoxypropionate, methyl 3-ethoxypropionate, ethyl 3-ethoxypropionate, methyl pyruvate, and ethyl pyruvate; aromatic hydrocarbons such as toluene and xylene; ketones such as 2-heptanone, 3-heptanone, 4-heptanone, and cyclohexanone; amides such as N-dimethylformamide, N-methylacetamide, N,N-dimethylacetamide, and N-methylpyrrolidone; lactones such as γ-butyrolactone; and the like.

These solvents (D) may be used either individually or in combination.

The solvent (D) is appropriately used depending on the thickness of the insulating film. The solvent (D) is normally used in an amount of 10 to 1000 parts by mass based on 100 parts by mass of the components other than the solvent (D), in order to provide the photosensitive insulating resin composition with storage stability.

Adhesion Improver (E)

The photosensitive insulating resin composition according to the embodiment of the present invention may further include an adhesion improver (hereinafter may be referred to as "adhesion improver (E)") that improves adhesion to a substrate.

Examples of the adhesion improver (E) include functional silane coupling agents having a reactive substituent (e.g., carboxyl group, methacryloyl group, isocyanate group, or epoxy group) and the like. Specific examples of the adhesion improver (E) include trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, β-(3,4-epoxycyclohexyl)ethyltrimethoxysilane, 1,3,5-N-tris(trimethoxysilylpropyl)isocyanurate, and the like.

These adhesion improvers (E) may be used either individually or in combination.

The content of the adhesion improver (E) is not particularly limited, but is preferably 0.2 to 10 parts by mass, and more preferably 0.5 to 8 parts by mass, based on 100 parts by mass of the resin (A). If the content of the adhesion improver (E) is 0.2 to 10 parts by mass, the resulting resin composition exhibits excellent storage stability and adhesion.

Crosslinked Polymer Particles (F)

The photosensitive insulating resin composition according to the embodiment of the present invention may further include crosslinked polymer particles (hereinafter may be referred to as "crosslinked polymer particles (F)") in order to improve the durability and the thermal shock resistance of the resulting cured product, for example.

The crosslinked polymer particles (F) are not particularly limited insofar as the polymer that forms the crosslinked polymer particles (F) has a glass transition temperature (Tg) of 0° C. or less. For example, it is preferable to use a copolymer of a crosslinkable monomer having two or more unsaturated polymerizable groups (hereinafter simply referred to as "crosslinkable monomer") and at least one monomer that is selected so that the crosslinked polymer particles (F) have a Tg of 0° C. or less. It is more preferable to use a copolymer of the crosslinkable monomer and two or more monomers other than the crosslinkable monomer, at least one of the monomers other than the crosslinkable monomer containing a functional group other than a polymerizable group (e.g., carboxyl group, epoxy group, amino group, isocyanate group, and hydroxyl group).

The polystyrene-reduced weight average molecular weight of the crosslinked polymer particles (F) is normally 1,000,000 or more.

The haze value of a 20 mass % ethyl lactate solution of the crosslinked polymer particles (F) is normally 8% or more. Note that the haze value of a 20 mass % ethyl lactate solution of the resin (A) is normally 0.5% or less. Specifically, the crosslinked polymer particles (F) differ from the resin (A) as to the haze value.

Examples of the crosslinkable monomer include compounds having a plurality of polymerizable unsaturated groups, such as divinylbenzene, diallyl phthalate, ethylene glycol di(meth)acrylate, propylene glycol di(meth)acrylate, trimethylolpropane tri(meth)acrylate, pentaerythritol tri(meth)acrylate, polyethylene glycol di(meth)acrylate, and polypropylene glycol di(meth)acrylate. Among these, divinylbenzene is preferable.

Examples of monomers other than the crosslinkable monomer include diene compounds such as butadiene, isoprene, dimethylbutadiene, chloroprene, and 1,3-pentadiene; unsaturated nitrile compounds such as (meth)acrylonitrile, α-chloroacrylonitrile, α-chloromethylacrylonitrile, α-methoxyacrylonitrile, α-ethoxyacrylonitrile, crotonitrile, cinnamonitrile, itaconitrile, maleonitrile, and fumaronitrile; unsaturated amides such as (meth)acrylamide, N,N'-methylenebis(meth)acrylamide, N,N'-ethylenebis(meth)acrylamide, N,N'-hexamethylenebis(meth)acrylamide, N-hydroxymethyl(meth)acrylamide, N-(2-hydroxyethyl)(meth)acrylamide, N,N-bis(2-hydroxyethyl)(meth)acrylamide, crotonamide, and cinnamamide; (meth)acrylate compounds such as methyl(meth)acrylate, ethyl(meth)acrylate, propyl(meth)acrylate, butyl(meth)acrylate, hexyl(meth)acrylate, lauryl(meth)acrylate, polyethylene glycol(meth)acrylate, and polypropylene glycol(meth)acrylate; aromatic vinyl compounds such as styrene, α-methylstyrene, o-methoxystyrene, p-hydroxystyrene, and p-isopropenylphenol; epoxy group-containing unsaturated compounds such as an epoxy (meth)acrylate obtained by reacting a diglycidyl ether of bisphenol A, diglycidyl ether of glycol, or the like and (meth)acrylic acid, hydroxyalkyl(meth)acrylate, or the like, a urethane(meth)acrylate obtained by reacting hydroxyalkyl (meth)acrylate and polyisocyanate, glycidyl(meth)acrylate, and (meth)allyl glycidyl ether; unsaturated acid compounds such as (meth)acrylic acid, itaconic acid, β-(meth)acryloxyethyl succinate, β-(meth)acryloxyethyl maleate, β-(meth)acryloxyethyl phthalate, and β-(meth)acryloxyethyl hexahydrophthalate; amino group-containing unsaturated compounds such as dimethylamino(meth)acrylate and diethylamino(meth)acrylate; amide group-containing unsaturated compounds such as (meth)acrylamide and dimethyl(meth)acrylamide; hydroxyl group-containing unsaturated compounds such as hydroxyethyl(meth)acrylate, hydroxypropyl(meth)acrylate, and hydroxybutyl(meth)acrylate; and the like.

Among these monomers, diene compounds such as butadiene, isoprene, dimethylbutadiene, chloroprene, and 1,3-pentadiene, isoprene, (meth)acrylonitrile, alkyl(meth)acrylates, styrene, p-hydroxystyrene, p-isopropenylphenol, glycidyl(meth)acrylate, (meth)acrylic acid, hydroxyalkyl (meth)acrylates, and the like are preferable.

The amount of the crosslinkable monomers used when producing the crosslinked polymer particles (F) is preferably 1 to 20 mass %, and more preferably 2 to 10 mass %, based on 100 mass % of the total amount of the monomers used for copolymerization.

When using the diene compound (particularly butadiene) as the monomer when producing the crosslinked polymer particles (F), the diene compound is preferably used in an amount of 20 to 80 mass %, and more preferably 30 to 70 mass %, based on 100 mass % of the total amount of the monomers used for copolymerization. If the amount of the diene compound is 20 to 80 mass %, soft and rubbery crosslinked polymer particles (F) are obtained. This prevents a situation in which cracks occur in the resulting cured product (e.g., insulating film) so that the insulating film or the like exhibits more excellent durability.

The average particle diameter of the crosslinked polymer particles (F) is normally 30 to 500 nm, preferably 40 to 200 nm, and more preferably 50 to 120 nm. The particle diameter of the crosslinked polymer particles (F) may be adjusted by an arbitrary method. For example, when synthesizing the crosslinked polymer particles by emulsion polymerization, the particle diameter of the crosslinked polymer particles may be adjusted by controlling the number of micelles during emulsion polymerization by adjusting the amount of emulsifier. The average particle diameter of the crosslinked polymer particles (F) is determined by diluting a dispersion of the crosslinked polymer particles by a known method, and measuring the particle diameter of the crosslinked polymer particles using a light scattering particle size analyzer ("LPA-3000" manufactured by Otsuka Electronics Co., Ltd.).

The crosslinked polymer particles (F) may be used either individually or in a combination.

The content of the crosslinked polymer particles (F) in the photosensitive insulating resin composition according to the embodiment of the present invention is preferably 0.5 to 50 parts by mass, and more preferably 1 to 30 parts by mass, based on 100 parts by mass of the resin (A). If the content of the crosslinked polymer particles (F) is 0.5 to 50 parts by mass, the crosslinked polymer particles (F) exhibit excellent dispersibility or mutual solubility with other components, and the thermal shock resistance and the heat resistance of the resulting insulating film or the like can be improved.

Other Additives

The photosensitive insulating resin composition according to the embodiment of the present invention may further include other additives insofar as the characteristics of the present invention are not adversely affected. Examples of other additives include a phenolic low-molecular-weight compound, an inorganic filler, a photosensitizer, a heat-sensitive acid generator, a quencher, a leveling agent, a surfactant, and the like.

Examples of the phenolic low-molecular-weight compound include 4,4'-{1-[4-[2-(4-hydroxyphenyl)-2-propyl]phenyl}ethylidene]bisphenol, 4,4'-{1-[4-[1-(4-hydroxyphenyl)-1-methylethyl]phenyl}ethylidene]bisphenol, 4,4'-dihydroxydiphenylmethane, 4,4'-dihydroxydiphenyl ether, tris(4-hydroxyphenyl)methane, 1,1-bis(4-hydroxyphenyl)-1-phenylethane, tris(4-hydroxyphenyl)ethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, 1,1-bis(4-hydroxyphenyl)-1-[4-[1-(4-hydroxyphenyl)-1-methylethyl]phenyl]ethane, 1,1,2,2-tetra(4-hydroxyphenyl)ethane, and the like.

These phenolic low-molecular-weight compounds may be used either individually or in combination.

The content of the phenolic low-molecular-weight compound is preferably 40 parts by mass or less, and more preferably 1 to 30 parts by mass, based on 100 parts by mass of the resin (A).

[2] Method of Producing Photosensitive Insulating Resin Composition

A method of producing the photosensitive insulating resin composition according to the embodiment of the present invention is not particularly limited. The photosensitive insulating resin composition according to the embodiment of the present invention may be produced by a known method. The photosensitive insulating resin composition may also be produced by charging a sample bottle with each component, sealing the sample bottle, and stirring the mixture on a wave rotor.

[3] Cured Product

The cured product according to the embodiment of the present invention is produced by curing the photosensitive insulating resin composition according to the embodiment of the present invention.

Since the photosensitive insulating resin composition according to the embodiment of the present invention exhibits excellent resolution, adhesion, thermal shock resistance, electrical insulating properties, patterning capability, elongation, and the like, the cured product of the photosensitive insulating resin composition may be suitably used as a surface protective film, a planarization film, and an interlayer dielectric of an electronic component (e.g., circuit board (semiconductor device) and semiconductor package), an insulating film material for a high-density mounting board, a photosensitive adhesive, a pressure-sensitive adhesive, and the like. The cured product may be particularly suitable as an interlayer dielectric or a planarization film of a circuit board.

[4] Method of Producing Insulating Film

The method of producing an insulating film according to the embodiment of the present invention includes (1) applying a photosensitive insulating resin composition to a substrate to form a film (hereinafter may be referred to as "step (1)"), (2) exposing the film through a mask (hereinafter may be referred to as "step (2)"), (3) heating the exposed film (hereinafter may be referred to as "step (3)"), (4) developing the heated film (hereinafter may be referred to as "step (4)"), and (5) heating the developed film (hereinafter may be referred to as "step (5)").

[Step (1)]

In the step (1), the photosensitive insulating resin composition is applied to the substrate, and dried to volatilize the solvent and the like to form a film. The photosensitive insulating resin composition may be the same as described above.

As the substrate (support), a resin-coated copper foil, a copper-clad laminated board, a silicon wafer provided with a sputtered metal film, an alumina substrate, or the like may be used.

The resin composition may be applied to the substrate by dipping, spraying, bar coating, roll coating, spin coating, or the like. The thickness of the film may be controlled by appropriately selecting the application method, the solid content and the viscosity of the resin composition solution, and the like.

[Step (2)]

In the step (2), the film formed in the step (1) is exposed through a mask having a desired pattern.

Examples of radiation used for exposure include ultraviolet rays, electron beams, laser beams, and the like emitted from a low-pressure mercury lamp, a high-pressure mercury lamp, a metal halide lamp, a g-line stepper, an h-line stepper, an i-line stepper, a KrF stepper, an ArF stepper, an EB exposure system, and the like.

The dose of radiation may be appropriately selected depending on the light source, the thickness of the resin film, and the like. For example, when applying ultraviolet rays emitted from a high-pressure mercury lamp, the dose may be set at about 100 to 20,000 $mJ/m^2$ when forming a resin film having a thickness of 10 to 50 μm.

[Step (3)]

In the step (3), the exposed film is heated (hereinafter referred to as "post-exposure bake (PEB)"). A curing reaction of the resin (A) and the crosslinking agent (B) is thus promoted by the acid generated by exposure.

The PEB conditions differ depending on the composition of the resin composition solution, the thickness of the film, and the like. PEB is normally performed at 70 to 150° C., and preferably 80 to 120° C. for about 1 to 60 minutes.

[Step (4)]

In the step (4), the exposed film is developed using an alkaline developer to dissolve and remove the unexposed area or the exposed area to form a desired pattern.

The development method may be shower development, spray development, immersion development, paddle development, or the like. The film is normally developed at 20 to 40° C. for about 1 to 10 minutes.

The alkaline developer may be an alkaline aqueous solution in which an alkaline compound (e.g., sodium hydroxide, potassium hydroxide, aqueous ammonia, tetramethylammonium hydroxide, or choline) is dissolved in water to a concentration of 1 to 10 mass %, for example. An appropriate amount of a water-soluble organic solvent (e.g., methanol or ethanol), a surfactant, and the like may be added to the alkaline aqueous solution. The film developed using the alkaline developer is washed with water, and then dried.

[Step (5)]

In the step (5), the developed film is heated to form an insulating film. The insulating film thus heated exhibits excellent properties. Moreover, the developed film can be sufficiently cured by heating.

The film may be cured at 50 to 250° C. for about 30 minutes to 10 hours. The film may be heated in a plurality of stages so that the film is cured sufficiently or deformation of the pattern shape does not occur. For example, the film may be heated (cured) at 50 to 120° C. for about 5 minutes to 2 hours in the first stage, and heated (cured) at 80 to 250° C. for about 10 minutes to 10 hours in the second stage. When using such curing conditions, an oven, an infrared furnace, or the like may be used.

EXAMPLES

The embodiment of the present invention is further described below by way of examples. Note that the present invention is not limited to the following examples. In the examples, "parts" and "%" respectively refer to "parts by mass" and "mass %", unless otherwise indicated.

[1] Production of Alkali-Soluble Resin

Production Example 1

Synthesis of Resin (A-1)

1 part by mass of divinylbenzene (manufactured by Nippon Steel Chemical Co., Ltd., purity: 57 mass %), 60 parts by mass of p-t-butoxystyrene, and 4 parts by mass of styrene were dissolved in 150 parts by mass of propylene glycol monomethyl ether. The mixture was polymerized at 70° C. for 10 hours in a nitrogen atmosphere in the presence of 4 parts by mass of azobisisobutyronitrile. After the addition of sulfuric acid to the reaction solution, the components were reacted at 90° C. for 10 hours to convert (deprotect) p-t-butoxystyrene to p-hydroxystyrene. After the addition of ethyl acetate to the resulting copolymer, the mixture was washed five times with water. After isolating the ethyl acetate phase, the solvent was removed to obtain a divinylbenzene/p-hydroxystyrene/styrene copolymer (hereinafter referred to as "resin (A-1)"). The resin (A-1) was analyzed by $^{13}$C-NMR. The resin (A-1) had a content of the structural unit (a1-1) derived from divinylbenzene of 1 mol %, a content of the structural unit (a2) derived from p-hydroxystyrene of 89 mol %, and a content of the structural unit (a3-1) derived from styrene of 10 mol %. The resin (A-1) had a polystyrene-reduced weight average molecular weight of 24,000.

The $^{13}$C-NMR analysis was performed using "JNM-EX270" (manufactured by JEOL Ltd.). The Mw was measured by GPC ("HLC-8220GPC" manufactured by Tosoh Corp.). Specifically, the Mw was measured by GPC using columns (G2000HXL×2, G3000HXL×1, G4000HXL×1) at a flow rate of 1.0 ml/min and a column temperature of 40° C. (eluate: tetrahydrofuran, standard material: monodispersed polystyrene).

Production Example 2

Synthesis of Resin (A-2)

A resin (A-2) was synthesized in the same manner as in Production Example 1, except for using 2 parts by mass of divinylbenzene and 65 parts by mass of p-t-butoxystyrene as the monomers. The resin (A-2) was analyzed in the same manner as in Production Example 1. The resin (A-2) had a content of the structural unit (a1-1) derived from divinylbenzene of 2 mol % and a content of the structural unit (a2) derived from p-hydroxystyrene of 98 mol %. The resin (A-2) had a polystyrene-reduced weight average molecular weight of 83,000.

Production Example 3

Synthesis of Resin (A-3)

A resin (A-3) was synthesized in the same manner as in Production Example 1, except for using 6 parts by mass of divinylbenzene, 60 parts by mass of p-t-butoxystyrene, and 4 parts by mass of styrene as the monomers. The resin (A-3) was analyzed in the same manner as in Production Example 1. The resin (A-3) had a content of the structural unit (a1-1) derived from divinylbenzene of 6 mol %, a content of the structural unit (a2) derived from p-hydroxystyrene of 84 mol %, and a content of the structural unit (a3-1) derived from styrene of 10 mol %. The resin (A-3) had a polystyrene-reduced weight average molecular weight of 104,000.

Production Example 4

Synthesis of Resin (A-4)

A resin (A-4) was synthesized in the same manner as in Production Example 1, except for using 2 parts by mass of triethylene glycol divinyl ether ("RAPI-CURE DVE-3" manufactured by ISP Japan, Ltd.) and 64 parts by mass of p-t-butoxystyrene as the monomers. The resin (A-4) was analyzed in the same manner as in Production Example 1. The resin (A-4) had a content of the structural unit (a1-2) derived from triethylene glycol divinyl ether of 1 mol % and a content of the structural unit (a2) derived from p-hydroxystyrene of 99 mol %. The resin (A-4) had a polystyrene-reduced weight average molecular weight of 92,000.

Comparative Production Example 1

Synthesis of Resin (AR-1)

70 parts by mass of p-t-butoxystyrene and 10 parts by mass of styrene were dissolved in 150 parts by mass of propylene glycol monomethyl ether. The mixture was polymerized at 70° C. for 10 hours in a nitrogen atmosphere in the presence of 4 parts by mass of azobisisobutyronitrile. After the addition of sulfuric acid to the reaction solution, the components were reacted at 90° C. for 10 hours to convert (deprotect) p-t-butoxystyrene to p-hydroxystyrene. After the addition of ethyl acetate to the resulting copolymer, the mixture was washed five times with water. After isolating the ethyl acetate phase, the solvent was removed to obtain a p-hydroxystyrene/styrene copolymer (hereinafter referred to as "resin (AR-1)"). The resin (AR-1) was analyzed in the same manner as in Production Example 1. The resin (AR-1) had a content of the structural unit (a2) derived from p-hydroxystyrene of 80 mol % and a content of the structural unit (a3-1) derived from styrene of 20 mol %. The resin (AR-1) had a polystyrene-reduced weight average molecular weight of 32,000.

Comparative Production Example 2

Synthesis of Resin (AR-2)

80 parts by mass of p-t-butoxystyrene was dissolved in 150 parts by mass of propylene glycol monomethyl ether. The mixture was polymerized at 70° C. for 10 hours in a nitrogen atmosphere in the presence of 4 parts by mass of azobisisobutyronitrile. After the addition of sulfuric acid to the reaction solution, the components were reacted at 90° C. for 10 hours to convert (deprotect) p-t-butoxystyrene to p-hydroxystyrene. After the addition of ethyl acetate to the resulting copolymer, the mixture was washed five times with water. After isolating the ethyl acetate phase, the solvent was removed to obtain a p-hydroxystyrene polymer (hereinafter referred to as "resin (AR-2)"). The resin (AR-2) was analyzed in the same manner as in Production Example 1. The resin (AR-2) had a polystyrene-reduced weight average molecular weight of 55,000.

Comparative Production Example 3

Synthesis of Resin (AR-3)

70 parts by mass of styrene and 25 parts by mass of vinyl benzoate were dissolved in 150 parts by mass of propylene glycol monomethyl ether. The mixture was polymerized at 70° C. for 10 hours in a nitrogen atmosphere in the presence of 2 parts by mass of azobisisobutyronitrile. After the addition of ethyl acetate to the resulting copolymer, the mixture was washed five times with water. After isolating the ethyl acetate phase, the solvent was removed to obtain a styrene/vinyl benzoate copolymer (hereinafter referred to as "resin (AR-3)"). The resin (AR-3) was analyzed in the same manner as in Production Example 1. The resin (AR-3) had a content of the structural unit (a3-1) derived from styrene of 80 mol % and a content of the structural unit (a3-2) derived from vinyl benzoate of 20 mol %. The resin (AR-3) had a polystyrene-reduced weight average molecular weight of 10,000.

Comparative Production Example 4

Synthesis of Resin (AR-4)

A commercially available novolac resin (cresol novolac resin "Sumilite Resin" (m-cresol:p-cresol=55:45 (molar ratio)) manufactured by Sumitomo Bakelite Co., Ltd., polystyrene-reduced weight average molecular weight: 6500) was used as a resin (AR-4).

Comparative Production Example 5

Synthesis of Resin (AR-5)

70 parts by mass of p-t-butoxystyrene and 10 parts by mass of styrene were dissolved in 150 parts by mass of propylene glycol monomethyl ether. The mixture was polymerized at 70° C. for 10 hours in a nitrogen atmosphere in the presence of 4 parts by mass of azobisisobutyronitrile. After the addition of sulfuric acid to the reaction solution, the components were reacted at 90° C. for 10 hours to convert (deprotect) p-t-butoxystyrene to p-hydroxystyrene. After the addition of ethyl acetate to the resulting copolymer, the mixture was washed five times with water. After isolating the ethyl acetate phase, the solvent was removed to obtain a p-hydroxystyrene/styrene copolymer (hereinafter referred to as "resin (AR-5)"). The resin (AR-5) was analyzed in the same manner as in Production Example 1. The resin (AR-5) had a content of the structural unit (a2) derived from p-hydroxystyrene of 80 mol % and a content of the structural unit (a3-1) derived from styrene of 20 mol %. The resin (AR-5) had a polystyrene-reduced weight average molecular weight of 10,000.

The content (mol %) of the structural units of each alkali-soluble resin ((A-1) to (A-4) and (AR-1) to (AR-5)) and the weight average molecular weight (Mw) of each alkali-soluble resin are shown in Table 1.

TABLE 1

| | Repeating unit (mol %) | | | | | Weight average molecular weight (Mw) |
|---|---|---|---|---|---|---|
| | (a1-1) | (a1-2) | (a2) | (a3-1) | (a3-2) | |
| Resin (A-1) | 1 | — | 89 | 10 | — | 24000 |
| Resin (A-2) | 2 | — | 98 | — | — | 83000 |
| Resin (A-3) | 6 | — | 84 | 10 | — | 104000 |
| Resin (A-4) | — | 1 | 99 | — | — | 92000 |
| Resin (AR-1) | — | — | 80 | 20 | — | 32000 |
| Resin (AR-2) | — | — | 100 | — | — | 55000 |
| Resin (AR-3) | — | — | — | 80 | 20 | 10000 |
| Resin (AR-4) | Novolac resin | | | | | 6500 |
| Resin (AR-5) | — | — | 80 | 20 | — | 10000 |

[2] Production of Photosensitive Insulating Resin Composition

Example 1

100 parts by mass of the resin (A-1), 5 parts by mass of a crosslinking agent (B-1), 15 parts by mass of a crosslinking agent (B-9), 1 part by mass of a photosensitive compound (C-2), 120 parts by mass of a solvent (D-1), 2.5 parts by mass of an adhesion improver (E-1), 5 parts by mass of crosslinked polymer particles (F-3), and 0.2 parts by mass of a surfactant (G-1) (see Table 2) were mixed (dissolved) to obtain a photosensitive insulating resin composition.

Examples 2 to 7 and Comparative Examples 1 to 9

The resin, crosslinking agent, photosensitive compound, solvent, adhesion improver, and surfactant shown in Table 2 were mixed in a mass ratio shown in Table 2 to obtain a photosensitive insulating resin composition.

In Example 5 and Comparative Examples 8 and 9, a phenol compound was also used in a mass ratio shown in Table 2. In Examples 3 and 4 and Comparative Examples 1 to 3, 6, and 7, crosslinked polymer particles were also used in a mass ratio shown in Table 2.

The photosensitive insulating resin composition of Example 6 is a positive-tone photosensitive insulating resin composition, and the photosensitive insulating resin compositions of Examples 1 to 5 and 7 and Comparative Examples 1 to 9 are negative-tone photosensitive insulating resin all compositions.

TABLE 2

| | Resin (type/parts) | Phenol compound (type/parts) | Crosslinking agent (type/parts) | | | Acid generator (type/parts) | Adhesion improver (type/parts) | Crosslinked polymer particles (type/parts) | Surfactant (type/parts) | Solvent (type/parts) |
|---|---|---|---|---|---|---|---|---|---|---|
| Example 1 | A-1/100 | — | B-1/5 | B-9/15 | — | C-2/1 | E-1/2.5 | F-3/5 | G-1/0.2 | D-1/120 |
| Example 2 | A-3/100 | — | B-5/30 | B-8/15 | — | C-1/4 | E-1/15 | — | G-2/0.2 | D-2/120 |
| Example 3 | A-1/100 | — | B-6/15 | B-8/20 | — | C-2/5 | E-1/10 | F-4/10 | G-1/0.1 | D-1/120 |
| Example 4 | A-2/100 | — | B-3/20 | B-5/20 | B-9/5 | C-3/3 | E-1/5 | F-3/5 | G-2/0.1 | D-1/150 |

TABLE 2-continued

|  | Resin (type/parts) | Phenol compound (type/parts) | Crosslinking agent (type/parts) | | | Acid generator (type/parts) | Adhesion improver (type/parts) | Crosslinked polymer particles (type/parts) | Surfactant (type/parts) | Solvent (type/parts) |
|---|---|---|---|---|---|---|---|---|---|---|
| Example 5 | A-2/80 | a-2/20 | B-1/15 | — | — | C-1/2 | E-2/10 | — | G-1/0.1 | D-2/150 |
| Example 6 | A-2/100 | — | B-4/10 | B-9/10 | — | C-4/25 | E-2/3 | — | G-1/0.1 | D-1/150 |
| Example 7 | A-4/100 | — | B-2/10 | B-6/5 | B-9/10 | C-4/27.5 | E-2/7 | — | G-1/0.1 | D-1/150 |
| Comparative Example 1 | AR-1/100 | — | B-1/30 | B-5/5 | B-7/30 | C-1/1 | E-1/5 | F-1/3 | G-1/0.2 | D-1/150 |
| Comparative Example 2 | AR-2/100 | — | B-3/25 | B-5/10 | B-9/25 | C-2/1.5 | E-2/10 | F-2/10 | G-2/0.1 | D-2/150 |
| Comparative Example 3 | AR-4/100 | — | B-1/5 | B-9/15 | — | C-2/3.5 | E-1/2.5 | F-3/5 | G-1/0.2 | D-1/120 |
| Comparative Example 4 | AR-4/100 | — | B-2/50 | B-6/5 | — | C-1/2 | E-2/10 | — | G-1/0.1 | D-1/120 |
| Comparative Example 5 | AR-3/100 | — | B-5/30 | B-8/15 | — | C-1/4 | E-1/15 | — | G-2/0.2 | D-2/120 |
| Comparative Example 6 | AR-5/100 | — | B-6/15 | B-8/20 | — | C-2/5 | E-1/10 | F-4/10 | G-1/0.1 | D-1/120 |
| Comparative Example 7 | AR-5/100 | — | B-3/20 | B-5/20 | B-9/5 | C-3/3 | E-1/5 | F-3/5 | G-2/0.1 | D-1/150 |
| Comparative Example 8 | AR-3/90 | a-1/10 | B-4/20 | B-6/40 | B-7/25 | C-2/4.5 | E-2/7.5 | — | G-1/0.2 | D-2/150 |
| Comparative Example 9 | AR-5/80 | a-2/20 | B-1/15 | B-7/10 | — | C-1/2 | E-2/10 | — | G-1/0.1 | D-2/150 |

The details of the components shown in Table 2 other than the alkali-soluble resin (A) are given below.
(a) Phenol Compound
a-1: 4,4'-{1-[4-[2-(4-hydroxyphenyl)-2-propyl]phenyl]ethylidene}bisphenol
a-2: 4,4'-{1-[4-[1-(4-hydroxyphenyl)-1-methylethyl]phenyl]ethylidene}bisphenol ("TrisP-PA" manufactured by Honshu Chemical Industry Co., Ltd.)
(B) Crosslinking Agent
B-1: trimethylolpropane polyglycidyl ether ("Epolight 100MF" manufactured by Kyoeisha Chemical Co., Ltd.)
B-2: bisphenol A epoxy resin ("Epicoat 828" manufactured by Japan Epoxy Resins Co., Ltd.)
B-3: aliphatic epoxy resin ("Denacol EX-610U-P" manufactured by Nagase ChemteX Corp.)
B-4: phenol-dicyclopentadiene epoxy resin ("XD-1000" manufactured by Nippon Kayaku Co., Ltd.)
B-5: 1,4-bis{[(3-ethyloxetan-3-yl)methoxy]methyl}benzene ("OXT-121" manufactured by Toagosei Co., Ltd.)
B-6: 4,4'-bis[(3-ethyl-3-oxetanyl)methoxymethyl]biphenyl ("ETERNACOLL OXBP" manufactured by Ube Industries, Ltd.)
B-7: o-hydroxybenzaldehyde
B-8: 2,6-bis(hydroxymethyl)-p-cresol
B-9: hexamethoxymethylmelamine ("Nikalac MW-390" manufactured by Sanwa Chemical Industries Co., Ltd.)
(C) Photosensitive Compound
C-1 (photoacid generator): 2-[2-(furan-2-yl)ethenyl]-4,6-bis(trichloromethyl)-s-triazine ("TFE-triazine" manufactured by Sanwa Chemical Co., Ltd.)
C-2 (photoacid generator): 2-[2-(5-methylfuran-2-yl)ethenyl]-4,6-bis(trichloromethyl)-s-triazine ("TME-triazine" manufactured by Sanwa Chemical Co., Ltd.)
C-3 (photoacid generator): 4-(phenylthio)phenyldiphenylsulfonium tris(pentafluoroethyl)trifluorophosphate ("CPI-210S" manufactured by San-Apro Ltd.)
C-4 (quinonediazide group-containing compound): quinonediazide sulfonate (2.0 mol condensate) obtained by esterification of 1,1-ビス (4-hydroxyphenyl)-1-[4-[1-(hydroxyphenyl)-1-methylethyl]phenyl]ethane and 1,2-naphthoquinonediazido-5-sulfonic acid
(D) Solvent
D-1: ethyl lactate
D-2: 2-heptanone
(E) Adhesion Improver
E-1: γ-glycidoxypropyltrimetoxysilane ("A-187" manufactured by Nippon Unicar Co., Ltd.)
E-2: 1,3,5-N-tris(trimethoxysilylpropyl)isocyanurate ("Y-11597" manufactured by GE Toshiba Silicones Co., Ltd.)
(F) Crosslinked Polymer Particles
F-1: butadiene/hydroxybutyl methacrylate/methacrylic acid/divinylbenzene copolymer (butadiene:hydroxybutyl methacrylate: methacrylic acid:divinylbenzene=50:47:2:1 (molar ratio))
F-2: butadiene/styrene/hydroxybutyl methacrylate/methacrylic acid/divinylbenzene copolymer (butadiene:styrene:hydroxybutyl methacrylate:methacrylic acid:divinylbenzene=48:20:24:6:2 (molar ratio))
F-3: butadiene/acrylonitrile/hydroxybutyl methacrylate/methacrylic acid/divinylbenzene copolymer (butadiene:acrylonitrile:hydroxybutyl methacrylate:methacrylic acid:divinylbenzene=48:20:24:6:2 (molar ratio))
F-4: butadiene/methacrylic acid/divinylbenzene copolymer (butadiene:methacrylic acid:divinylbenzene=78:20:2 (molar ratio))
(G) Surfactant
G-1: fluorine-based surfactant ("FTX-218" manufactured by NEOS Co., Ltd.)
G-2: silicone-based surfactant ("SH-28PA" manufactured by Dow Corning Toray Silicone Co., Ltd.)

[3] Evaluation of Photosensitive Insulating Resin Composition

The properties of the photosensitive insulating resin compositions of Examples 1 to 7 and Comparative Examples 1 to 9 were evaluated by the following methods. The results are shown in Table 3.

(1) Resolution

The photosensitive insulating resin composition was spin-coated onto a 6-inch silicon wafer, and heated at 110° C. for three minutes using a hot plate to form a uniform resin film having a thickness of 20 μm. The resin film was exposed to ultraviolet rays emitted from a high-pressure mercury lamp through a pattern mask (a mask having a square light-transmitting area (negative-tone photosensitive insulating resin composition) or a mask having a square light-shielding area (positive-tone photosensitive insulating resin composition)) using an aligner ("MA-100" manufactured by Karl Suss) so that the dose at a wavelength of 365 nm was 500 mJ/cm². The resin film was then heated (PEB) at 110° C. for three minutes using a hot plate, and developed at 23° C. for 120 seconds in a 2.38 mass % tetramethylammonium hydroxide aqueous solution. The minimum dimension of the resulting pattern was evaluated as resolution.

The presence or absence of development failure was also checked. A case where development failure did not occur was evaluated as "Good", and a case where development failure occurred was evaluated as "Bad".

(2) Sensitivity

The photosensitive insulating resin composition was spin-coated onto a 6-inch silicon wafer, and heated at 110° C. for three minutes using a hot plate to form a uniform resin film having a thickness of 20 μm. The resin film was exposed to ultraviolet rays (wavelength: 365 nm) emitted from a high-pressure mercury lamp through a pattern mask (5×5 μm) using an aligner ("MA-100" manufactured by Karl Suss). The resin film was then heated (PEB) at 110° C. for three minutes using a hot plate, and developed at 23° C. for 120 seconds in a 2.38 mass % tetramethylammonium hydroxide aqueous solution. The minimum dose at which a pattern having dimensions of 5×5 μm was formed was evaluated as sensitivity.

(3) Stress (Warping) of Insulating Film

The photosensitive insulating resin composition was spin-coated onto an 8-inch silicon wafer, and heated at 110° C. for three minutes using a hot plate to form a uniform resin film having a thickness of 20 μm. The entire resin film was exposed to ultraviolet rays emitted from a high-pressure mercury lamp using an aligner ("MA-100" manufactured by Karl Suss) so that the dose at a wavelength of 365 nm was 500 mJ/cm². Note that the resin film was exposed only when using the negative-tone photosensitive insulating resin composition (i.e., the resin film was subjected to the subsequent step without performing the exposure step when using the positive-tone photosensitive insulating resin composition). The resin film was then heated (PEB) at 110° C. for three minutes using a hot plate, and developed at 23° C. for 120 seconds in a 2.38 mass % tetramethylammonium hydroxide aqueous solution. The resin film was then cured at 190° C. for one hour using a convection oven to form an insulating film. The difference in stress of the substrate was measured before and after forming the insulating film using a stress measuring device ("FLX-2320-s" manufactured by TOHO Technology (transferred from KLA-Tencor)).

(4) Elongation

The photosensitive insulating resin composition was applied to a PET film, and heated at 110° C. for 10 minutes using a convection oven. After heating the film at 200° C. for one hour using the convection oven, the film was removed from the PET film to obtain a cured film having a thickness of 50 μm. The cured film was cut in the shape of a dumbbell (width: 5 mm) to obtain a specimen. The elongation of the specimen was measured in accordance with JIS K7113 (plastic tensile test method) using a thermomechanical analyzer ("TMA/SS6100" manufactured by Seiko Instruments Inc.).

(5) Electrical Insulating Properties

The photosensitive insulating resin composition was applied to an insulation evaluation substrate 3 (see FIG. 1) having a copper foil pattern 2 (thickness: 10 μm) on a substrate 1, and heated at 110° C. for three minutes using a hot plate to form a substrate having a resin film (thickness on the copper foil 2: 10 μm). The resin film was then cured at 190° C. for one hour using a convection oven to form an insulating film. The volume of the insulating film between the electrodes was $1.6 \times 10^{-8}$ cm³. The substrate 3 was placed in a migration evaluation system ("AEI, EHS-221MD" manufactured by Tabai Espec Corp.), and processed for 200 hours at a temperature of 121° C., a humidity of 85%, a pressure of 1.2 atm, and an applied voltage of 5 V. The resistance (Ω) of the test substrate was measured to evaluate the insulating properties.

(6) Adhesion

The photosensitive insulating resin composition was applied to an $SiO_2$-sputtered silicon wafer, and heated at 110° C. for five minutes using a hot plate to form a uniform resin film having a thickness of 10 μm. The resin film was cured at 200° C. for one hour using a convection oven to obtain a cured film. The cured film was processed for 168 hours using a pressure cooker tester ("EHS-221MD" manufactured by Tabai Espec Corp.) at a temperature of 121° C., a humidity of 100%, and a pressure of 2.1 atm. A cross-cut test was performed in accordance with JIS K5400-5-6 to evaluate adhesion before and after the test.

(7) Thermal Shock Resistance (Heat Cycle Test)

Figure 2:
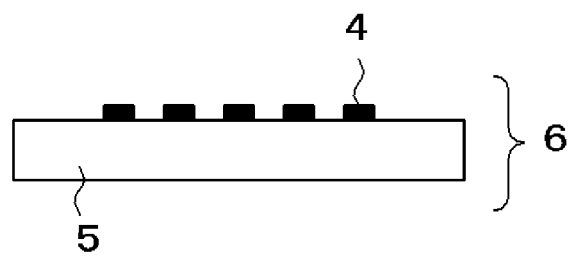
FIG. 2 is a schematic view illustrative of a thermal shock resistance evaluation substrate.
Figure 3:
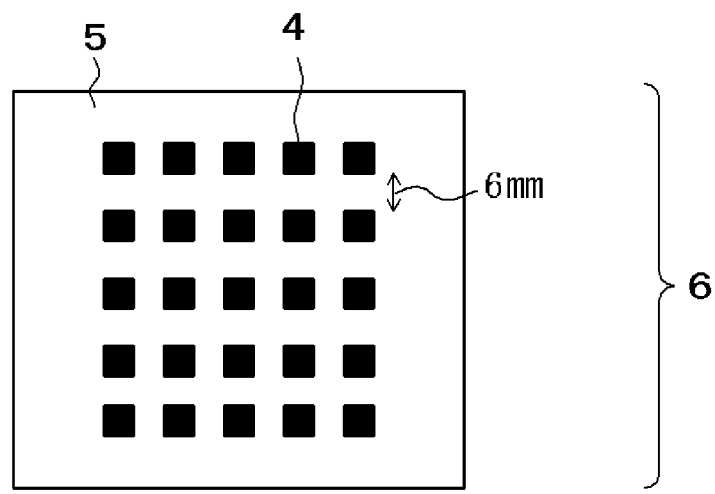
FIG. 3 is a schematic view illustrative of a thermal shock resistance evaluation substrate.

The photosensitive insulating resin composition was applied to a thermal shock resistance evaluation substrate 6 (see FIGS. 2 and 3) having a copper foil pattern 4 (thickness: 10 μm) on a substrate 5, and heated at 110° C. for five minutes using a hot plate to form a substrate having a resin film (thickness on the copper foil 4: 10 μm). The resin film was then cured at 190° C. for one hour using a convection oven to form a cured film. The substrate 6 was subjected to a durability test (one cycle: −65° C./30 min to 150° C./30 min) using a thermal shock tester ("TSA-40L" manufactured by Tabai Espec Corp.). The substrate 6 subjected to the durability test was observed using a microscope (magnification: 200). Whether or not defects (e.g., cracks) occurred in the cured film was determined every 100 cycles.

TABLE 3

| | Resolution (μm) | Development failure | Sensitivity (J/m²) | Warping (MPa) | Elongation (%) | Insulating properties (Ω) | Adhesion Before test | After test | Thermal shock resistance (cycle) |
|---|---|---|---|---|---|---|---|---|---|
| Example 1 | 5 | Good | 1500 | 10 | 12 | $5 \times 10^{12}$ | 100/100 | 100/100 | 2200 or more |
| Example 2 | 5 | Good | 2200 | 11 | 9 | $3 \times 10^{12}$ | 100/100 | 100/100 | 2200 or more |

TABLE 3-continued

| | Resolution (μm) | Development failure | Sensitivity (J/m$^2$) | Warping (MPa) | Elongation (%) | Insulating properties (Ω) | Adhesion Before test | Adhesion After test | Thermal shock resistance (cycle) |
|---|---|---|---|---|---|---|---|---|---|
| Example 3 | 5 | Good | 1700 | 12 | 12 | $5 \times 10^{12}$ | 100/100 | 100/100 | 2200 or more |
| Example 4 | 5 | Good | 1500 | 5 | 11 | $5 \times 10^{12}$ | 100/100 | 100/100 | 2200 or more |
| Example 5 | 5 | Good | 1600 | 8 | 7 | $5 \times 10^{12}$ | 100/100 | 100/100 | 2200 or more |
| Example 6 | 5 | Good | 2000 | 11 | 7 | $4 \times 10^{12}$ | 100/100 | 100/100 | 2200 or more |
| Example 7 | 5 | Good | 1800 | 6 | 13 | $4 \times 10^{12}$ | 100/100 | 100/100 | 2200 or more |
| Comparative Example 1 | 20 | Bad | 5200 | 26 | 3 | $7 \times 10^{12}$ | 100/100 | 100/100 | 2200 or more |
| Comparative Example 2 | 20 | Bad | 6300 | 23 | 3 | $6 \times 10^{12}$ | 100/100 | 100/100 | 2200 or more |
| Comparative Example 3 | 5 | Good | 7500 | 35 | 2 | $4 \times 10^{12}$ | 100/100 | 100/100 | 2200 or more |
| Comparative Example 4 | 5 | Good | 5500 | 23 | 1 | $5 \times 10^{12}$ | 100/100 | 100/100 | 2200 or more |
| Comparative Example 5 | 5 | Good | 9200 | 40 | 2 | $4 \times 10^{12}$ | 100/100 | 100/100 | 2200 or more |
| Comparative Example 6 | 5 | Good | 7000 | 31 | 2 | $5 \times 10^{12}$ | 100/100 | 100/100 | 2200 or more |
| Comparative Example 7 | 5 | Good | 8000 | 33 | 3 | $3 \times 10^{12}$ | 100/100 | 100/100 | 2200 or more |
| Comparative Example 8 | 5 | Good | 8200 | 29 | 2 | $5 \times 10^{12}$ | 100/100 | 100/100 | 2200 or more |
| Comparative Example 9 | 5 | Good | 7900 | 30 | 1 | $7 \times 10^{12}$ | 100/100 | 100/100 | 2200 or more |

As shown in Table 3, it was confirmed that warping and elongation of the substrate when forming the insulating film were suppressed in Examples 1 to 7 while achieving excellent resolution, sensitivity, electrical insulating properties, adhesion, and thermal shock resistance.

Since the photosensitive insulating resin composition according to the embodiment of the present invention contains a specific alkali-soluble resin, it is possible to form a cured product (e.g., insulating film) that exhibits excellent resolution, sensitivity, electrical insulating properties, and the like, while sufficiently suppressing warping and elongation of a substrate when forming an insulating film.

When the structural unit (a1) is a structural unit derived from divinylbenzene, warping and elongation can be further suppressed.

When the molar ratio ((a1)/(a2)) of the structural unit (a1) to the structural unit (a2) is 0.001 to 10, excellent alkali developability is achieved while sufficiently reducing stress of the resulting insulating film.

When the photosensitive insulating resin composition contains the adhesion improver (E), the adhesion of the cured product (e.g., insulating film) to a substrate can be further improved.

When the photosensitive insulating resin composition contains the crosslinked polymer particles (F), the durability and the thermal shock resistance of the cured product can be further improved.

When the photosensitive compound (C) is a photoacid generator and the composition is a negative-tone photosensitive insulating resin composition, a negative-tone pattern can be formed while sufficiently suppressing warping and elongation of a substrate when forming an insulating film or the like. Moreover, it is possible to form a cured product (e.g., insulating film) that exhibits excellent resolution, electrical insulating properties, and the like.

When the crosslinking agent (B) contained in the negative-tone photosensitive insulating resin composition is at least one compound selected from (b1) a compound that contains two or more alkyl-etherified amino groups in the molecule, (b2) an oxirane ring-containing compound, and (b3) an oxetanyl ring-containing compound, it is possible to form a cured product (e.g., insulating film) that exhibits excellent resolution and chemical resistance.

When the photosensitive compound (C) is a quinonediazide group-containing compound and the composition is a positive-tone photosensitive insulating resin composition, a positive-tone pattern can be formed so that a cured product (e.g., insulating film) that exhibits excellent resolution, electrical insulating properties, and the like can be formed. Moreover, it is possible to sufficiently suppress warping and elongation of a substrate when forming an insulating film.

When the crosslinking agent (B) contained in the positive-tone photosensitive insulating resin composition is at least one compound selected from (b1) a compound that contains two or more alkyl-etherified amino groups in the molecule, (b2) an oxirane ring-containing compound, and (b3) an oxetanyl ring-containing compound, it is possible to form a cured product (e.g., insulating film) that exhibits excellent resolution and chemical resistance.

The cured product according to the embodiment of the present invention that is produced by curing the photosensitive insulating resin composition according to the embodiment of the present invention exhibits excellent resolution, electrical insulating properties, and the like.

The method of producing an insulating film according to the embodiment of the present invention makes it possible to form an insulating film that exhibits excellent resolution, electrical insulating properties, and the like, while sufficiently suppressing warping and elongation of a substrate when forming the insulating film.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A photosensitive insulating resin composition comprising:
    (A) an alkali-soluble resin that contains (a1) a structural unit derived from a crosslinkable monomer and (a2) a structural unit having a phenolic hydroxyl group;
    (B) a crosslinking agent;
    (C) a photosensitive compound generating an acid upon exposure to radiation; and
    (D) a solvent.

2. The photosensitive insulating resin composition according to claim 1, wherein the structural unit (a1) comprises a structural unit derived from divinylbenzene.

3. The photosensitive insulating resin composition according to claim 1, wherein the alkali-soluble resin (A) has a polystyrene-reduced weight average molecular weight determined by gel permeation column chromatography of 10,000 to 300,000.

4. The photosensitive insulating resin composition according to claim 1, wherein a molar ratio ((a1)/(a2)) of the structural unit (a1) to the structural unit (a2) is 0.001 to 10.

5. The photosensitive insulating resin composition according to claim 1, further comprising:
    (E) an adhesion improver.

6. The photosensitive insulating resin composition according to claim 1, further comprising:
    (F) crosslinked polymer particles.

7. The photosensitive insulating resin composition according to claim 1, wherein the photosensitive insulating resin composition is a negative-tone photosensitive insulating resin composition.

8. The photosensitive insulating resin composition according to claim 7, wherein the crosslinking agent (B) comprises at least one of (b1) a compound that contains two or more alkyl-etherified amino groups in the molecule, (b2) an oxirane ring-containing compound, and (b3) an oxetanyl ring-containing compound.

9. The photosensitive insulating resin composition according to claim 1, wherein the photosensitive compound (C) comprises a quinonediazide group-containing compound, and wherein the photosensitive insulating resin composition is a positive-tone photosensitive insulating resin composition.

10. The photosensitive insulating resin composition according to claim 9, wherein the crosslinking agent (B) comprises at least one of (b1) a compound that contains two or more alkyl-etherified amino groups in the molecule, (b2) an oxirane ring-containing compound, and (b3) an oxetanyl ring-containing compound.

11. A cured product obtained by curing a photosensitive insulating resin composition, the photosensitive insulating resin composition comprising:
    (A) an alkali-soluble resin that contains (a1) a structural unit derived from a crosslinkable monomer and (a2) a structural unit having a phenolic hydroxyl group;
    (B) a crosslinking agent;
    (C) a photosensitive compound generating an acid upon exposure to radiation; and
    (D) a solvent.

12. A method of producing an insulating film, the method comprising:
    applying a photosensitive insulating resin composition to a substrate to form a film, the photosensitive insulating resin composition comprising:
    (A) an alkali-soluble resin that contains (a1) a structural unit derived from a crosslinkable monomer and (a2) a structural unit having a phenolic hydroxyl group;
    (B) a crosslinking agent;
    (C) a photosensitive compound generating an acid upon exposure to radiation; and
    (D) a solvent;
    exposing the film through a mask;
    heating the exposed film;
    developing the heated film; and
    heating the developed film.

* * * * *